United States Patent [19]
Park et al.
[11] Patent Number: 5,049,540
[45] Date of Patent: Sep. 17, 1991

[54] METHOD AND MEANS FOR SEPARATING AND CLASSIFYING SUPERCONDUCTIVE PARTICLES

[75] Inventors: Jin Y. Park; Robert J. Kearney, both of Moscow, Id.
[73] Assignee: Idaho Research Foundation, Moscow, Id.

[21] Appl. No.: 353,341
[22] Filed: May 17, 1989

Related U.S. Application Data

[63] Continuation-in-part of Ser. No. 117,490, Nov. 5, 1987, abandoned.

[51] Int. Cl.[5] .................... H01L 39/24; B03B 1/00; B03C 1/02
[52] U.S. Cl. .................... 505/1; 209/2; 209/11; 209/212; 505/727; 505/932
[58] Field of Search .................... 209/11, 212, 2; 505/725, 727, 931-933, 1

[56] References Cited

U.S. PATENT DOCUMENTS

| | | | |
|---|---|---|---|
| 3,595,386 | 7/1971 | Hradel | 209/232 X |
| 4,235,710 | 11/1980 | Sun | 209/213 |
| 4,526,681 | 7/1985 | Friedlaender et al. | 209/214 |
| 4,828,685 | 5/1989 | Stephens | 209/11 |

FOREIGN PATENT DOCUMENTS

| | | | |
|---|---|---|---|
| 0320083 | 6/1989 | European Pat. Off. | 505/727 |
| 47-45720 | 11/1972 | Japan | 505/931 |
| 63-291653 | 11/1988 | Japan | 505/727 |
| 63-319069 | 12/1988 | Japan | 209/212 |
| 64-22361 | 1/1989 | Japan | 505/727 |
| 1-123643 | 5/1989 | Japan | 209/11 |
| 1-130745 | 5/1989 | Japan | 209/11 |
| 1-215358 | 8/1989 | Japan | 209/11 |
| 1-258753 | 10/1989 | Japan | 209/11 |
| 698657 | 11/1979 | U.S.S.R. | 209/212 |
| 950442 | 8/1982 | U.S.S.R. | 209/212 |
| 1269841 | 11/1986 | U.S.S.R. | 209/212 |

OTHER PUBLICATIONS

Vieira, et al., "A Simple Device for Quick Separation of High-Tc Superconducting Materials". Oct. 10, 1987, Journal of Physics & Scientific Instrument Edition, vol. 20, pp. 1292-1293.
Barsoum, "use of the Meissner Effect to Separate, Purify, and Classify Superconducting Powders". Oct. 19, 1987.
Riley, et al., "Meissner Effect Up to 300 K in Microscopic Regions of Y-Ba-Cu-O". Jan. 1, 1988, The American Physical Society, Physical Review B, vol. 37, No. 1, pp. 559-561.
Friedlaender, et al., "Diamagnetic Capture in Single Wire HGMS". IEEE Transactions on Magnetics, vol. Mag.-15, No. 6, Nov. 1979.
Yang, et al., "A Magnetic Control Valve for Flowing Solids: Exploratory Studies". American Chemical Society, Ind. Eng. Chem. Process Des. Dev., vol. 21, No. 4, 1982.
Takayasu, et al., "Continuous Selective HGMS in the Repulsive Force Mode". IEEE Transactions on Magnetics, vol. MAG-20, No. 5, Sep. 1984.
Bednorz, et al., "Possible High Tc Superconductivity in the Ba-La-Cu-O System". Z. Phys. B. Condensed Matter 1986.

(List continued on next page.)

*Primary Examiner*—Michael S. Huppert
*Assistant Examiner*—Edward M. Wacyra
*Attorney, Agent, or Firm*—Scully, Scott, Murphy & Presser

[57] ABSTRACT

The specification and drawings describe a series of devices and methods for classifying and separating superconductive particles. The superconductive particles may be separated from non-superconductive particles, and the superconductive particles may be separated by degrees of susceptibility to the Meissner effect force. The particles may also be simultaneously separated by size or volume and mass to obtain substantially homogeneous groups of particles. The separation techniques include levitation, preferential sedimentation and preferential concentration. Multiple separation vector forces are disclosed.

27 Claims, 18 Drawing Sheets

OTHER PUBLICATIONS

Wu, et al., "Superconductivity at 93 K in a New Mixed-Phase Y-Ba-Cu-O Compound System at Ambient Pressure". Physical Review Letters vol. 58, No. 9, Mar. 1987.

Ovshinsky, et al., "Superconductivity at 155 K". Physical Review Letters vol. 58, No. 24, Jun. 1987, pp. 2579-2581.

Peric, et al., "Size of Josephson Junctions in Ba-Y--Cu-O compounds". Physical Review B, vol. 37, No. 1, Jan. 1988, pp. 522-524.

Cava, et al., "Bulk Superconductivity at 91 K in Single-Phase Oxygen-Deficient Perovskite $Ba_2YCu_3O_{9-\delta}$". Physical Review Letters, vol. 58, No. 16, Apr. 1987, pp. 1676-1679.

Solin, et al., "Field-Induced Orientation of Nonlevitated Microcrystals of Superconducting $YBa_2Cu_3O_{7-x}$". Physical Review Letters, vol. 60, No. 8, Feb. 1988.

Garcia, et al., "High Tc Superconductive Materials: Bulk or Twinned Domain/Grain Boundary Percolative Network Superconductors?".

Gallagher, et al., "Identification and Preparation of Single Phase 90 K Oxide Superconductor and Structural Determination by Lattice Imaging".

Worthington, et al., "Anisotropic Nature of High-Temperature Superconductivity in Single-Crystal $Y_1Ba_2Cu_3O_{7-x}$".

Ekin, et al., "Evidence for Weak Link and Anisotrophy Limitations on the Transport Critical Current in Bulk Polycrystalline $Y_1Ba_2Cu_3O_x$".

Hazen, et al., "Superconductivity in the High-Tc Bi--Ca-Sr-Cu-O System: Phase Identification". Physical Review Letters, vol. 60, No. 12 Mar. 1988, pp. 1174-1177.

Sheng, et al., "Bulk Superconductivity at 120 K in the Tl-Ca/Ba-Cu-O System".

Blank, et al., "Preparation of $YBa_2Cu_3O_{7-\delta}$ by Citrate Synthesis and Pyrolysis".

Jin, et al., "High Critical Currents in Y-Ba-Cu-O Superconductors". Appl. Phys. Lett., vol. 52, No. 24, Jun. 1988, pp. 2074-2076.

Jin et al., "Melt-Textured Growth of Polycrystalline $YBa_2Cu_3O_{7-\delta}$ with High Transport Jc at 77 K". Physical Review B, vol. 37, No. 13 May 1988, pp. 7850-7853.

Hidaka et al., "Large Anistrophy of the Upper Critical Magnetic Field in Single Crystal Bi-(Sr, Ca)-Cu-O".

Kupfer, et al., "Weak Link Problem and Intragrain Current Density Polycrystalline $Bi_1Ca_1Cu_2O_x$ and $Tl_2Ca_2Ba_1Ca_1Cu_2O_x$ and $Tl_2Ca_2Ba_2Cu_3O_{10}$".

Subramanian, et al., "A New High-Temperature Superconductor: $Bi_2Sr_{3-x}Ca_xCu_2O_{8+y}$".

Tanaka, et al., "Effects of Synthesis Conditions on the Properties of a Superconducting Bi-Sr-Ca-Cu-O System".

Sheng, et al., "New 120 K Tl-Ca-Ba-Cu-O Suerconductor". Appl. Phys. Lett., vol. 52, No. 20, May 1988, pp. 1738-1740.

Parkin, et al., "Bulk Superconductivity at 125 K in $Tl_2Ca_2Ba_2Cu_3O_x$". Physical Review Letters, vol. 60, No. 24, Jun. 1988, pp. 2539-2542.

Tallon, et al., "High-Tc Superconducting Phase in the Series $Bi_{2.1}(Ca,Sr)_{n+1}Cu_nO_{2n+4}\delta$". Nature, vol. 333, May 1988.

Beyers, et al., "Crystallallography and Microstructure of Tl-Ca-Ba-Cu-O Superconducting Oxides". Appl. Phys. Lett. vol. 53, Aug. 1988, No. 5.

Morosin, et al., "Single Crystals of $Tl_5Ba_5Ca_2Cu_6O_x$: A 106 K Superconductor". Physica C152, 1988, pp. 223-227.

Ginley, et al., "A 120 K Bulk Superconductor: $(Tl_1Ba_1Ca_1)\ Cu_2O_x$".

Dimos, et al., "Orientation Dependence of Grain/-Boundary Critical Currents in $YBa_2Cu_3)_{7-\delta}$ Bicrystals". Physical Review Letters vol. 61, No. 2, Jul. 1988.

Chippindale, et al., "Chemical Chracterization and Superconductivity of Two Phases in the Bi-Sr-Ca-Cu-O Systems".

Harzen, et al., "100-K Superconducting Phase in the Tl-Ca-Ba-Cu-O Systems". Physical Review Letters, vol. 60, No. 16, Apr. 1988, pp. 1657-1660.

Cheetham, et al., "Control of Copper Valence in $Bi_2Sr_{2-x}CaCu_2O\delta$".

Marshall, et al., "Two-Dimensional Superstructure in the (001) Plane of $Bi_2[Ca,Sr]_3Cu_2O_{8+}$, Thin Films". Appl. Phys. Lett. vol. 53, No. 5, Aug. 1988, pp. 426-420.

D. A. Bonn, et al., "Far-Infrared Conductivity of the High-Tc Superconductor $YBa_2Cu_3O_x$". Physical Review Letters, vol. 58, No. 21, May 1987 pp. 2249-2250.

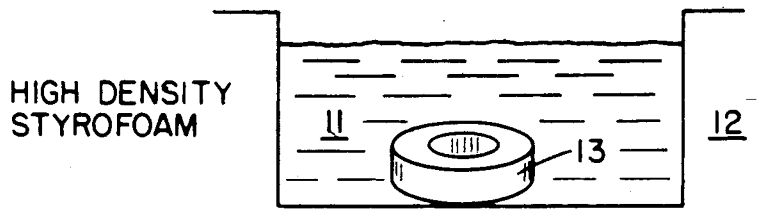
FIG. 1 EXPERIMENTAL APPARATUS
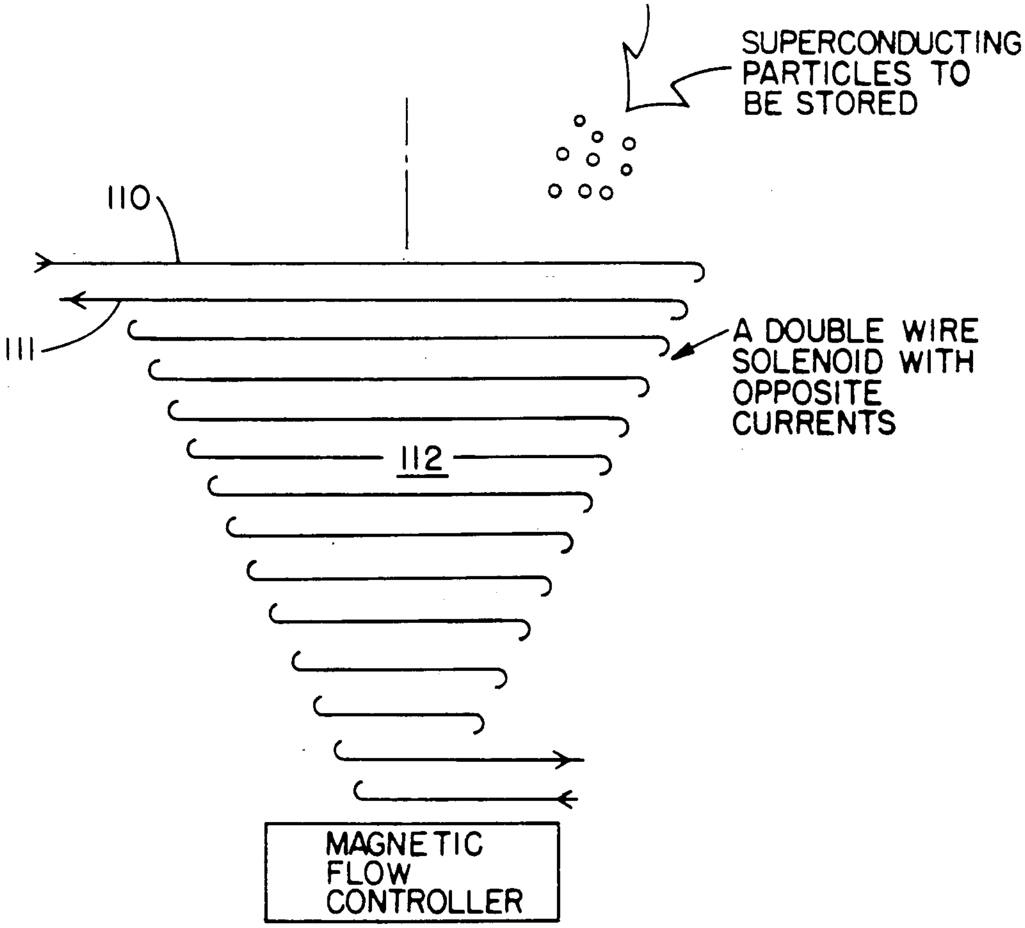
FIG. 2

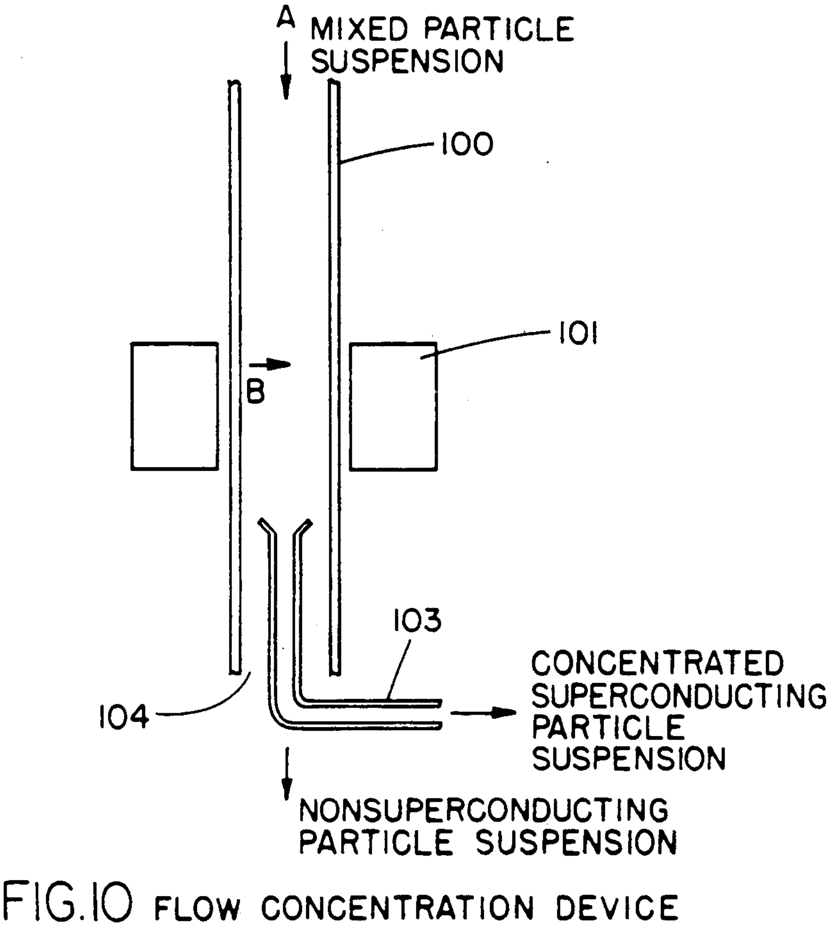
FIG. 10 FLOW CONCENTRATION DEVICE
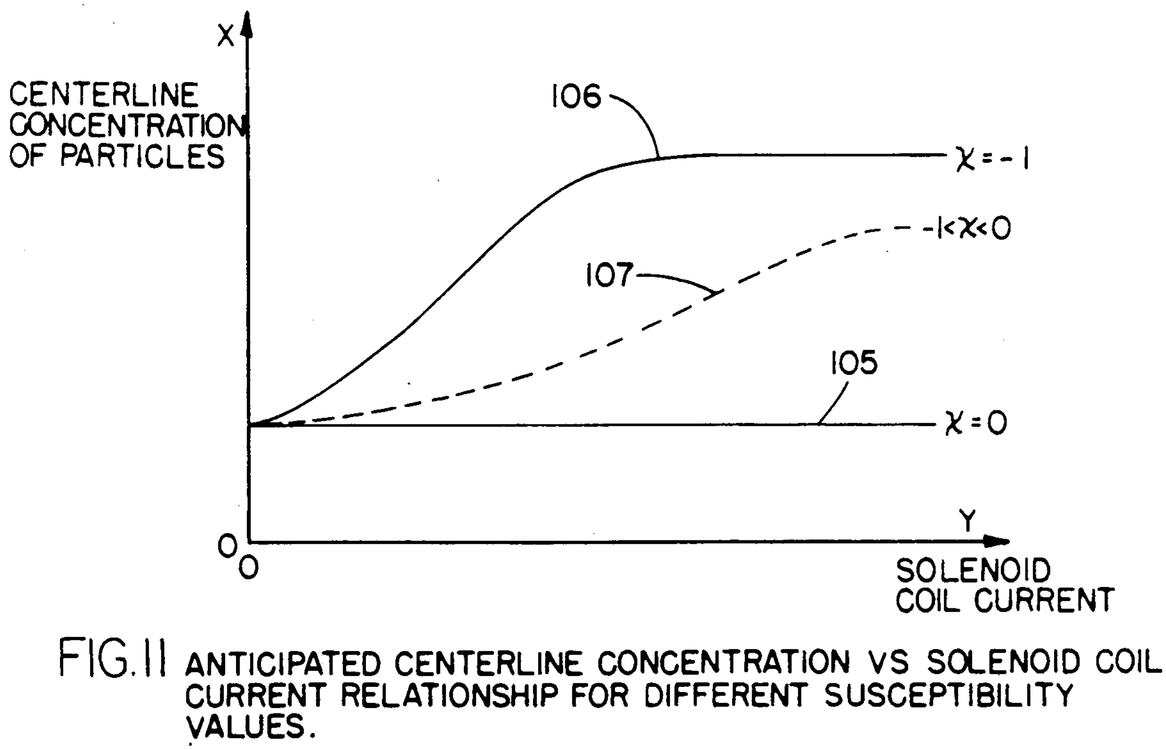
FIG. 11 ANTICIPATED CENTERLINE CONCENTRATION VS SOLENOID COIL CURRENT RELATIONSHIP FOR DIFFERENT SUSCEPTIBILITY VALUES.

METHOD AND MEANS FOR SEPARATING AND CLASSIFYING SUPERCONDUCTIVE PARTICLES

This invention was made with Government support under contract number EGG-C85-110544 awarded by the Department of Energy. The Government has certain rights in this invention.

CROSS REFERENCE TO RELATED APPLICATIONS

This application is a continuation-in-part of our copending application, U.S. Ser. No. 07/117,490, filed Nov. 5, 1987, entitled Method and Means for Separating and Classifying Superconductive Particles, now abandoned.

Field of the Invention

The present invention relates to the field of separation and classification of superconductive particles, and in particular to:

a) the separation of superconducting particles from a mixture of superconducting and non-superconducting particles which may or may not be suspended in a fluid, and b) the classification of superconducting particles in terms of size, density, transition temperature, magnetic susceptibility, type and degree of superconductivity or any combination of these properties.

BACKGROUND OF THE INVENTION

The recent discovery of high temperature superconductive materials has triggered tremendous research effort in chemistry, physics and processing of these ceramic materials. While the search for new high $T_c$ materials still continues and possible superconductivity at 200° K. in these materials is projected the research effort to this date has already produced a number of materials which show significant promise for applications. These include the 95° K. Y-Ba-Cu-O material, the 105° K. Bi-Ca-Sr-CU-O material, the 125° K. Tl-Ca-Ba-Cu-O material and their copper-oxide based variations.

The vast majority of the bulk high $T_c$ materials are presently synthesized by solid state reaction This synthesis method, however, results in significant local inhomogeneity in composition and phase, thereby requiring subsequent separation and purification. Wet chemical synthesis from organometallic precursors is known to reduce the local inhomogeneity in the bulk materials. However, this synthesis method has accomplished only limited success to this date mainly due to the limited availability of appropriate precursors. Moreover, there is growing evidence that the extremely small colloidal particles produced by this method, typically in the size range of 500–1000 A, are too small to induce superconductivity as individual grains.

The critical current density $J_c$ is one of the most important parameters of a superconducting material from an applications standpoint. Critical current densities in the order of $10^5$–$10^6$ A/cm$^2$ are desired in bulk superconductors for the vast majority of applications including those for microelectronics. To date, the maximum value obtained with bulk samples is still two orders of magnitude lower than that needed for large scale applications.

Initially, superconductivity in the ceramic high $T_c$ compounds was thought to be an isotropic bulk phenomenon. However, there is increasing evidence that anisotropic layers have a significant effect. For example, Garcia and co-workers, in *Phys. Rev. Lett.*, 60, 744 (1988), have recently reported that isolated single grains of Y-Ba-Cu-O material did not levitate in a magnetic field gradient However, a bulk specimen made from these grains did levitate in the same magnetic field These researchers attributed these observations to the localization of superconductivity in the twin boundary region. These twin boundaries in isolated grains will align when placed in a magnetic field gradient. Such alignment results in a minimum Meissner effect force. However, when particles are agglomerated, there is no preferred direction of alignment and the Meissner effect force is significant.

The Meissner effect, first discovered in 1933, generally refers to almost complete exclusion of magnetic flux from a bulk specimen in the superconductive state. This effect has been often demonstrated graphically in terms of certain repulsive forces resulting from the magnetic flux exclusion Two such graphical demonstrations are shown in the book *Superconductivity*, by A. W. B. Taylor, published by Wykehom Publications (London) Ltd. 1970, in which a permanent magnet is shown to levitate above a superconductive material and in which a superconductive sphere is shown to float over a solenoid coil. In each case, the repulsive force created by the magnetic flux exclusion are shown to be balanced by the weight of the floating object (which is the magnet in the first case and the superconductive sphere in the second case).

Recent developments in the area of superconductivity have lead to the synthesis of new ceramic materials that are superconductive at temperatures $T_c$ as high as 125° K. However, synthesis of superconductive ceramic materials often does not result in uniform superconducting particles. Some researchers in the field have reported from 24% to 50% non-superconductive particles in each batch synthesized. Further, while some of the particles are non-conductive, others of the particles are partially superconductive, and partially superconductive by different amounts The scientific community is presently unable to provide a conclusive theory or mechanism for the superconductivity of these new compounds. Further, future development of superconductor technology will require effective methods and means for separating and classifying superconductive particles.

U.S. Pat. No. 4,526,681 is representative of a large number of patents which disclose the separation of magnetically susceptible particles in a colloidal suspension by the application of a magnetic field to form a magnetic susceptibility gradient.

U.S. Pat. No. 4,235,710 describes a magnetic separator having rounded poles to maximize the magnetic energy gradient of the device. It is illustrative of commercially available Franz magnetic separators.

The article *A Magnetic Control Valve for Flowing Solids: Exploratory Studies* by Yang, et al., appearing in Ind. Eng. Chem. Process Des. Dev., Vol. 21, No. 4 in 1982 discloses a flow control valve for controlling the flow of magnetically susceptible solids in a pipe by the application of a magnetic field to a conductive grate and iron screen disposed across the pipe.

SUMMARY OF THE INVENTION

Magnetic separation methods have been used in the past for the separation and purification of magnetic and diamagnetic particles. However, the diamagnetism in superconductive particles differs from that in normal diamagnetic particles in several respects. First, the diamagnetism in superconductive materials is due to exclusion of magnetic flux from a superconducting phase, whereas the diamagnetism in normal diamagnetic materials, is due to change in the magnetic moment of orbital electrons. Furthermore, superconductivity is observed only under certain conditions while normal diamagnetic materials are generally invariant with such conditions. Therefore, these are two different phenomena by definition. Second, superconductive materials have tremendously large magnetic susceptibility values (in absolute number), as high as $-1$, compared to normal diamagnetic materials whose magnetic susceptibility values are typically of the order of $-0.00001$. Third, it has been found that ceramic superconductive particles, at a certain size, have a weak magnetic susceptibility, compared to larger particles, even though both are equally superconductive. It is believed that these smaller particles have a basal plane which will orient itself with the direction of the magnetic field gradient, and thus exhibit reduced susceptibility because of the alignment of a superconductive basal plane with the gradient. This basal plane may also be twinned in the Yttrium based ceramic superconductor. It is further believed that larger particles are an agglomeration of many crystals, or domains, each of which has a basal plane oriented in a different direction. This provides a strong diamagnetic effect, because regardless of particle orientation, there will be some domains with their basal planes transverse to the gradient, thereby producing susceptibility values which result in a significant Meissner effect force.

OBJECTS OF THE INVENTION

It is therefore an object of the present invention to provide a means and method for separating superconductive particles from the non-superconductive particles which may or the present invention to separate the superconductive particles from a suspending fluid, and to classify the superconductive particles in terms of size, density, degree and type of superconductivity, or any combination of these properties. Further, the apparatus of the present invention can also classify the particles by their magnetic susceptibility.

Another object of this invention is to isolate uniform sized single grains, so that their microscopic and macroscopic superconductivity properties are the same. These grains can be subsequently aligned by the application of an external field gradient and then consolidated to obtain a high critical current density.

In the method of separating superconductive particles from non-superconductive particles, the present invention provides a separation by means of levitation, sedimentation and by concentration.

In separating superconductive particles from non-superconductive particles by levitation, a mixture of the superconductive and non-superconductive particles are fed to a separator station wherein the station has at least one passageway defined therein for passing partially superconductive and non-superconductive particles therethrough. A magnetic field gradient is applied to each passageway defined in the separator to block the movement of the superconductive particles through the passageway by the Meissner effect force. Particles having a partial or weak susceptibility values, which may be strongly superconductive, may be separated by varying the intensity of the magnetic field gradient. Non-superconductive particles pass through the passageway and the separated superconductive particles may then be removed from above the separator station, or the gradient intensity may be varied to separate the strongly susceptible from the weakly susceptible particles. In one embodiment of the invention, the particles are separated in a batch mode, while in another embodiment of the invention the particles are separated in a continuous manner by tilting the separator stations to provide a gravity discharge of the separated particles. Further, the present invention can be enhanced to provide a plurality of separator stations arrayed one above the other with different magnetic gradients applied to each of the separator discharge openings to further select the superconductive particles on the basis of their apparent magnetic susceptibility.

In the method and apparatus for separating and classifying superconductive particles by sedimentation, a mixture of superconductive and non-superconductive particles are present in a moving fluid, and the fluid is directed along a first flow path to define a first vector of movement. A magnetic field gradient is then applied to the flow path to accelerate the superconductive particles along the first flow path vector. By altering the flow path of the fluid after the acceleration of the particles, a second vector of movement is added to the suspended particles by virtue of the fluid drag The superconductive and non-superconductive particles may then be collected along a spatial gradient by their susceptible value, with the highest susceptibility superconductive particles aligned closest to the first vector, having been preferentially accelerated by the magnetic field gradient. Further, the particles may be separated by size along this gradient inasmuch as the fluid drag will preferentially affect those particles having the highest surface area to mass ratio.

Extremely fine superconductive particles on the order of 0.1 μm to 100 μm may be separated and classified by feeding a mixture of superconductive, and non-superconductive particles into a moving fluid to form a suspension, and directing the suspension along a flow path which defines a first vector. A magnetic field gradient is then applied to the flow path to preferentially add a second vector of movement to the superconductive particles. The superconductive particles are then collected along the resultant vector. In this embodiment, a laminar flow of the suspension is established within a cylindrical flow path with the collector for the concentrated superconductive particles mounted along the axis of the cylinder. By applying a magnetic field gradient to the flow path, the superconductive particles will be collected within the center of the cylindrical flow path.

A further embodiment comprises a planar concentration process in which fine particles are suspended in a moving fluid and subjected to both a magnetic field gradient and gravity. A dilute, mixed-particle suspension is continuously supplied, and an external magnetic field gradient classifies the particles based on their susceptibility to Meissner effect force so that the particles will be spatially separated both by size and apparent susceptibility.

DESCRIPTION OF THE DRAWINGS

FIG. 1 is a diagrammatic cross-section of an experimental apparatus used to perform the experiments described in the specification.

FIG. 2 is a diagrammatic view of a containerless means for holding and transporting superconductive particles.

FIG. 10 is a diagrammatic cross-section of a concentrator particularly adapted for use in the present invention.

FIG. 11 is a graph illustrating the concentration of superconductive particles by the apparatus illustrated in FIG. 10, as a function of current flow.

FIG. 22b is a top plan view of the separator shown in FIG. 22a.

FIG. 23b is a top plan view of the separator shown in FIG. 23a.

FIG. 24b is a side diagrammatic view of the fluidized bed container shown in FIG. 24a.

FIG. 25b is a side diagrammatic view of the embodiment shown in FIG. 25a.

FIG. 26b is a top diagrammatic view of the embodiment container illustrated in FIG. 26a.

DETAILED DESCRIPTION OF THE PREFERRED EMBODIMENTS

Figure 3:
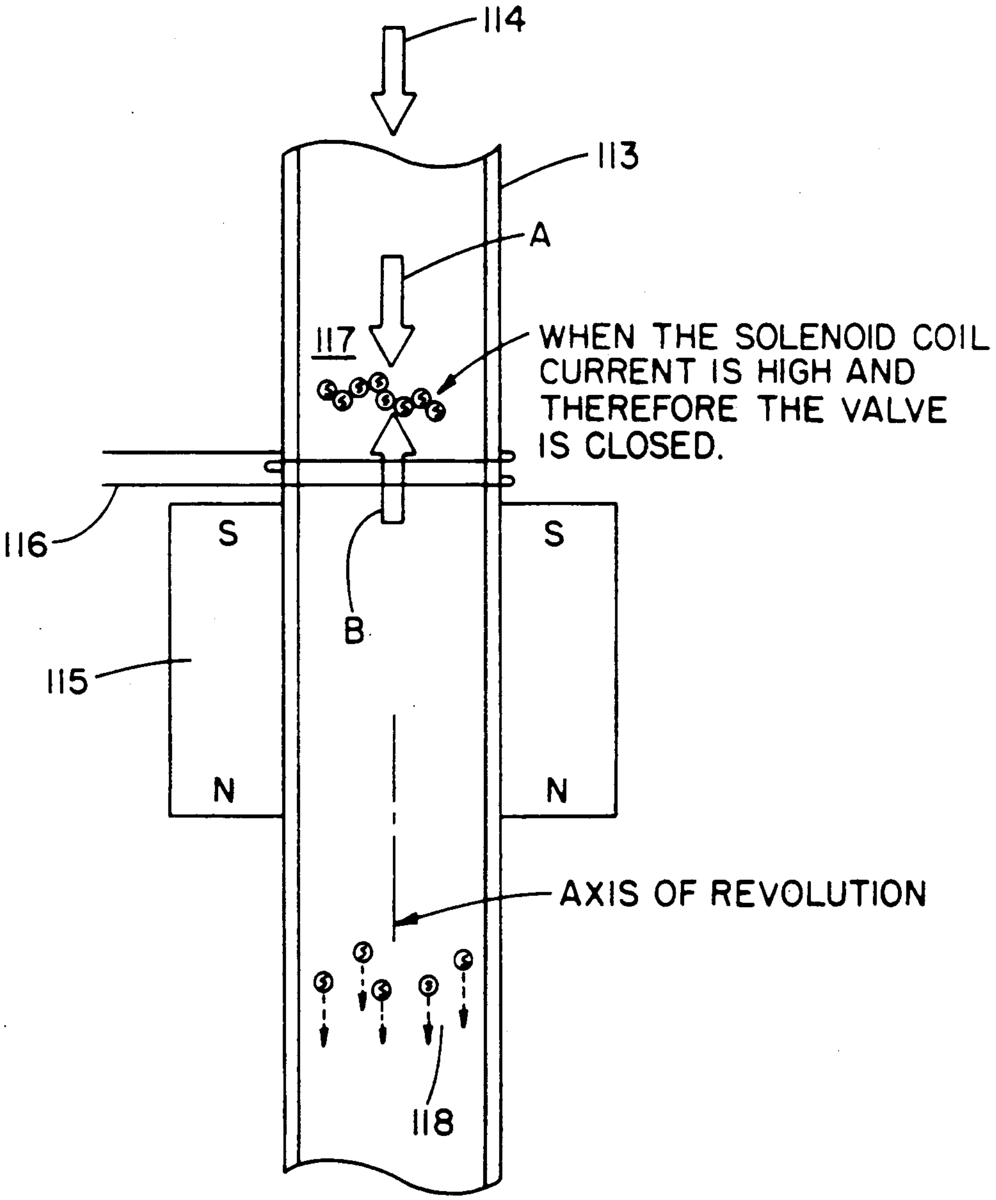
FIG. 3 is a diagrammatic and cross-sectional view of a flow control valve for superconductive particles.

The specification describes several methods for the separation and classification of superconducting particles including:

a) by levitation via the Meissner effect force, b) by preferential sedimentation via the Meissner effect force, and c) by preferential concentration, using the Meissner effect force. In addition, separate devices for implementing each of these methods in either batch or continuous mode are disclosed.

d) by preferential sedimentation and/or concentration using a variable Meissner effect force and a volume responsive vector force.

THEORETICAL CONSIDERATIONS

The origin of the Meissner effect force is well understood and the electromagnetic forces can be calculated with reasonable accuracy by those skilled in the art.

When a small perfect superconductor sphere of diameter $d_p$ is immersed in a fluid of permeability $\mu_o$ and subject to a magnetic field of flux density B, the repulsive force $F_M$ due to the Meissner effect is given by $$F_M = -\frac{\pi d_p^3}{4\mu_o}(B \cdot \nabla)B \quad (1)$$

The magnetic flux density along the axis of a uniform solenoid of radius a, length 1, number of turns N and current I is given by $$B_Z = \frac{\mu_o NI}{2l}\left[\frac{Z + l}{\sqrt{(Z + l)^2 + a^2}} - \frac{Z}{\sqrt{Z^2 + a^2}}\right] \quad (2)$$

and its axial derivative by $$\frac{dB_Z}{dZ} = \frac{\mu_o NIa^2}{2l}\left[\frac{1}{((Z + l)^2 + a^2)^{3/2}} - \frac{1}{(Z^2 + a^2)^{3/2}}\right] \quad (3)$$

in which the distance Z is measured upward from the top of the solenoid. Therefore, the repulsive force along the axis of the solenoid is given as function of Z by $$F_{M,Z} = -\frac{\pi d_p^3}{4\mu_o} \cdot B_Z \cdot \frac{dB_Z}{dZ} \quad (4)$$

This is the repulsive force which keeps the superconductive sphere from falling.

The physics of the Meissner effect force is well known, especially in the case of a single particle interacting with a given magnetic field gradient, but this is not what is claimed in the present application. The present invention is several processes where this known principle of physics is used to effect certain separations in the processing of superconductive particles.

In addition to the repulsive force of the Meissner effect discussed above, the Meissner effect force can be used in combination with several other forces to classify superconductive particles according to size, shape, density, magnetic susceptibility, $T_c$, and degree and type of superconductivity.

Under general conditions, the motion of a single particle (or any individual particle in a sparsely populated multi-particle system) is governed by $$V_p P_p \frac{dU_p}{dt} = F_M + F_G + F_D \quad (5)$$

in which the various forces and their use for the classification are discussed below for a spherical particle:

a) The Meissner effect force:

$$F_M = -\frac{\pi d_p^3}{4\mu_o}(B \cdot \nabla)B \quad (1)$$

This equation is precisely valid for a perfect superconductive sphere. Deviation from this equation can therefore be measured and related to the extent of magnetic flux penetration and/or the degree of superconductivity.

b) Body acceleration force:

$$\vec{F}_G = \frac{\pi d_p^3}{6}(P_p - P_f)\vec{g} \quad (6)$$

in which $P_f$ and $P_p$ are the density of the fluid and of the particle, respectively. This force represents the combination of all body accelerations acting on the particle such as gravity and centrifugal acceleration. When necessary, this force can be manipulated.

c) Fluid drag force:

$$\vec{F}_D = \frac{\pi d_p^2 P_f C_D}{8}|\vec{U}_f - \vec{U}_p|(\vec{U}_f - \vec{U}_p) \quad (7)$$

in which $U_f$ and $U_p$ are the velocity vecters for the fluid and for the particle respectively, and $C_D$ is the drag coefficient which is in turn dependent on $d_p$, $U_f - U_p$, $f$, and viscosity of the fluid.

d) Sedimentation of Superconductive Particles

When the particle has reached its terminal velocity, the acceleration term vanishes and the equation of particle motion becomes $$0 = \vec{F}_M + \vec{F}_G + \vec{F}_D \quad (8)$$

This equation contains the terms which form the basis of the conventional sedimentation techniques ($0 = \vec{F}_G + \vec{F}_D$), and one additional term $\vec{F}_M$ which can be exploited to better regulate sedimentation time (or velocity). For example, a special solenoid can be made to create a uniform field of $(\vec{B}.\vec{\nabla})\vec{B}$ independent of distance and its value controlled by regulating the current through the coil. This facilitates the analysis of superconducting particles beyond the capabilities of the conventional sediography. Liquid nitrogen may be used as the fluid media for the analysis of the newly found ceramic superconductors.

e) Magnetic Susceptibility Measurement

When the particle size is known, hence $F_G$ and $F_D$ values, Equation (8) can be solved for $F_M$, or $$\vec{F}_M = -(\vec{F}_G + \vec{F}_D) \quad (9)$$

The data on $F_M$ for different particle sizes will then allow one to experimentally determine the magnetic susceptibility of superconductive particles.

f) $T_c$ Measurement for Superconducting Particles

The measurement of $\vec{F}_M$ in accordance with Equation (9) at different temperatures can be related to the temperature dependence of the superconductivity of the particle, including the measurement of $T_c$.

EXAMPLES

A small sample of yttrium-barium-copper oxide superconductor material was prepared in accordance with the recipe reported by D. A. Bonn et al. (Physical Review Letters, Vol. 58, No. 21, p. 2249, May, 25, 1987). This recipe is generally known to produce a mixture of various Y-Ba-Cu-O compounds with different elemental compositions and structures, of which the $YBa_2Cu_3O_7$ ceramic is responsible for the superconductivity at temperature below approximately 90K. The sample produced by the recipe was crushed into particles in the size range 0.5-5 mm, which were then used for the following experiments without any further treatment.

Recently, the Y-Ba-Cu-O compound has also been made by a wet-chemistry technique using organo-metallic complexes. The latter method offers the advantage of performing the calcination step with ultrafine particles of 50–100 nm size which already possess the required stoichiometry. Both of the above-mentioned synthesis methods may be used for preparation of superconducting materials.

FIG. 1 illustrates schematically the experimental apparatus used in the following experiments. The apparatus consisted of a liquid nitrogen pool 11, approximately 60 mm in diameter and 20 mm in depth, formed on a block of high density styrofoam 12, a small rare earth cobalt magnet 13 shaped in a ring of dimensions 19.0 mm OD, 10.9 mm ID and 6.35 mm thickness, and small tweezers. The maximum field strength of the magnet was 8 Kgauss estimated from the manufacturer's specification. The liquid nitrogen temperature (77K) was substantially lower than the reported critical temperature of the $YBa_2Cu_3O_7$ superconductor (90K).

EXPERIMENT 1

A total of 30 particles were selected randomly from the sample storage container. These particles were placed in the liquid nitrogen pool along with the magnet. Each of these particles was then lifted by means of the tweezers and gently placed on top of the magnet while still being immersed in liquid nitrogen. In this experiment, 21 particles levitated above the magnet due to strong Meissner effect force, while the other nine particles passed through the magnetic ring. Of these nine particles, four appeared to have superconductivity because they were repelled when placed on the rim of the magnet; however, the Meissner effect force was not strong enough for these particles to levitate above the magnet against gravity. The other five particles showed no Meissner effect force that could be visually detected.

Therefore, using an apparatus illustrated in FIG. 1, and a simple experimental procedure, it was demonstrated that:

a) superconductive particles can be separated from non-superconductive particles using the Meissner effect force;

b) superconducting particles having a strong susceptibility to the Meissner effect can be separated from superconductive particles having a partial susceptibility to the Meissner effect force; and c) the particles produced by chemical synthesis do show significantly different levels of susceptibility and superconductivity. Further analysis of the entire sample particles showed that 24% of the sample particles (or 0.43 grams of 1.76 grams total) were either non-superconductive, partially superconductive, or partially susceptible to the Meissner effect force.

EXPERIMENT 2

A second experiment was performed with the same apparatus illustrated in FIG. 1, but with a continuous feed of sample particles. Therefore, more than one strongly superconductive particles were allowed to levitate above the magnet, while non-superconductive, partially superconductive and superconductive particles having partial susceptibility to the Meissner effect fell through the magnet ring. As the levitating particles tended to aggregate toward the center (due to the radial Meissner effect force which pushed particles toward the center), the aggregate had to be either gently broken apart or moved around by the tweezers in order to provide an opening for the non-superconductive or partially susceptible superconductive particles to fall through.

Therefore, using the apparatus illustrated in FIG. 1 and a simple experimental procedure, it was possible to demonstrate the feasibility of the separation process with a continuous feed of mixed particles.

EXPERIMENT 3

In order to demonstrate the feasibility of separating superconductive particles from the suspending fluid, the magnet was initially immersed in the liquid nitrogen pool and superconductive particles levitated on top of the magnet. The magnet was then lifted up and taken out of the liquid nitrogen pool. The superconductive particles continued to levitate above the magnet while it was being lifted in the liquid nitrogen pool and for a while after the magnet had been taken out of the liquid nitrogen pool (until the particle temperatures reached the critical temperature).

Therefore, using the apparatus illustrated in FIG. 1 and a simple experimental procedure, it was possible to demonstrate: a) superconducting particles can be separated from the suspending fluid against the fluid motion and other forces; b) the separation is effective when the suspending fluid is liquid as well as when the suspending fluid is gas; c) the separation may also be achieved across a fluid-fluid interface.

When Experiment 1 was completed, it became clear that even the levitating sample particles (referred to as "strongly superconducting") were not perfect superconductors with the susceptibility value of $-1$. If they were, their levitation positions would have been much higher than those observed in that experiment.

In the absence of any further data, the magnetic field provided by the ring magnet was assumed to be comparable to the one generated by a solenoid coil having the same geometrical dimensions of the magnet, that is, radius $a=5.45$ mm and length $l=6.35$ mm. For this solenoid coil to provide the same maximum magnetic field strength as the magnet (0.8 tesla), the required current-turn was found to be NI=8000 Ampere-turns, from Equation (2) above ($B_z=0.8$ tesla at $z=-l/2=-3.175\times 100^{-3}$m with $\mu_o=4\times 10^{-7}$ tesla m/Ampere). Once the NI value is known, the Meissner effect force $F_M$ may be calculated as a function of distance above the solenoid by Equations (2), (3) and (4) above when the diameter of the particle $d_p$ is known.

For a particle levitating at a fixed position in a stationary fluid, Equation (5) above reduced to $\vec{F}_M=\vec{F}_G$ (with $\vec{U}_P=0$ and $\vec{F}_D=0$) where the gravity force $F_G$ is given by Equation (6) above.

The force balance equation was then solved to determine the levitation position z with appropriate values substituted for the variables appearing in this equation. The conditions of our experiment were taken to be:

$a=.5.4\times 10^{-3}$ m $l=6.35\times 10^{-3}$ m

NI = 8000 Ampere-turns (estimated)
$\mu_o 4\times10^{-7}$ tesla m/Ampere
$P_f = 810$ Kg/m$^3$ for liquid nitrogen
$P_f = 5000$ Kg/m$^3$ for the superconducting particle (estimated)
$g = 9.8$ m/s$^2$ for gravity
$d_p 2\times10^{-3}$ m any other value (Notice that both $\vec{F}_M$ and $\vec{F}_G$ contain the term $d_p^3$ and therefore the result of this calculation is independent of $d_p$). The solution of the force balance equation under the above conditions gives a z value of $17.5\times10^{-3}$ m (or 17.5 mm). This would be the levitation height for a perfect superconductive particle with the magnetic susceptibility value of $-1$.

In a subsequent experiment, the levitation heights of some selected sample particles were measured. Roughly spherical particles of approximately 2 mm in diameter were used in this experiment. The measured levitation heights were typically in the range of 1.0–1.5 mm. These values are much lower than the predicted value of 17.5 mm for a perfect superconductive particle.

Although we are unable to provide a precise explanation for this experimental result at the present time, it is thought to be the result of the following approximations made in the theoretical prediction:

(a) The susceptibility of the $YBa_2Cu_3O_7$ superconductor is undoubtedly not $-1$. In fact, Gallagher et al. (Solid State Communications, Vol. 63, No. 2, pp. 147-150, 1987) reported a susceptibility value of approximately $-0.1$ for this material. If the particle is not perfectly superconductive, Equation (4) above should be revised to read (F. C. Moon, "Magneto-Solid Mechanics," John Wiley & Sons, New York, 1984)

$$F_{M,Z} = \frac{2\chi_p}{3-\chi_p}\cdot\frac{\pi d_p^3}{4\cdot\mu_o}\cdot B_Z\cdot\frac{dB_Z}{dZ}$$

in which $\chi_p$ is the magnetic susceptibility.

(b) As indicated by the results of Experiment 1, our sample and therefor the individual particles contained a substantial amount of non-superconductive phase. Since this effect was not accounted for in Equation (4), our calculation may have significantly overestimated the Meissner effect force (c) The assumptions made in the estimation of the magnetic field strength constitute a crude approximation at best. Since $F_{M,z}$ is proportional to $B_z^2$, an order of magnitude error in the estimation of $B_z$ could have produced two orders of magnitude error in the calculation of $F_{M,z}$.

(d) Finally, certain simplifying assumptions made in the derivation of Equation (4) and its application to particles of finite dimensions (while the equation is most accurate along the axis), could also have caused some error.

As set forth in this application, the term superconductive is intended to encompass all of the following types of superconductive materials: (a) strongly superconductive (probable agglomeration of multiple and randomly oriented basal planes), (b) partially susceptible superconductive particles having a lower susceptibility to the Meissner effect force because of preferential basal plane orientation, and (c) partially or weakly superconductive particles, which are particles having a substantial amount of non-superconducting phase material mixed therein. The term non-superconductive is used to describe materials that are not superconductive either because of phase or impurities, or particles that are comprised of non-superconductive materials.

SEPARATION BY LEVITATION

Figure 4:
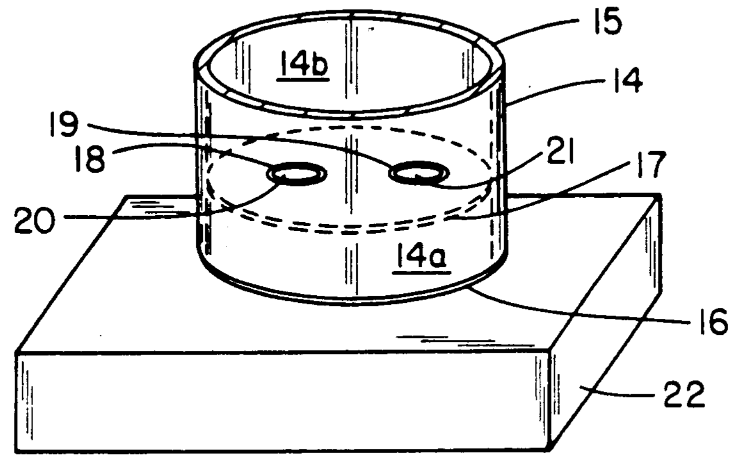
FIG. 4 is a diagrammatic and isometric view of a single stage levitation batch separator.

FIG. 4 illustrates a one stage levitation device for batch separation of superconductive particles from non-superconductive particles. As illustrated in FIG. 4, the apparatus includes an insulating wall 14, means 15 for fitting a cover (cover not shown), a bottom plate 16 and an intermediate support wall 17. The intermediate support wall 17 has fixed therein a pair of ring magnets 18 and 19 with passageways 20 and 21 defined therein. The passageways 20 and 21 extend not only through the magnets, but also the intermediary support wall 17. The container 14 rests on a mechanical vibrating support means 22.

In operation, a mixture of superconductive and non-superconductive particles is placed in container 14. The magnetic field gradients generated by magnets 20 and 21 will cause the superconductive particles to levitate above the intermediate support plate 17, while non-superconductive particles will pass through the passageways 20 and 21 to be collected in the lower part **14*a* of container 14, on top of the bottom coverplate 16. When the superconductive particles are fed into the container 14, it is essential that their temperature be below $T_c$ for the superconductive particles to be separated. As a practical matter, this would mean that for previous low temperature superconductive materials, the container 14 would be filled with liquid helium, while with the new ceramic superconductive materials, the container 14** could be filled with liquid nitrogen. Alternately, small batches of the material could be chilled to a temperature well below $T_c$, and the separation step carried out quickly before the particles have had a chance to warm above $T_c$.

It is to be understood that the apparatus illustrated in FIG. 4 is schematic in nature, and intended for the purpose of illustration. Permanent magnets 20 and 21 could be replaced with the magnetic grid illustrated in FIG. **6*a*, or a plurality of magnets having a plurality of passageways could completely cover the surface of intermediate support 17. In addition, in order to speed the separation of the non-superconductive particles, the intermediate wall 17 could be formed in a shape of a cone or an inverted paraboloid having a magnet disposed at the apex thereof, with additional magnets along the side walls of the cone, if desired. The vibratory motion provided by mechanical vibrator 22 is to assist in the mechanical passage of the non-superconductive particles through openings 20 and 21, as is well known in the art of mechanical separation. After the non-superconductive particles have been collected in the lower portion 14*a*, the superconductive particles are removed from their levitating position 14*b* in container 14**.

Figure 5:
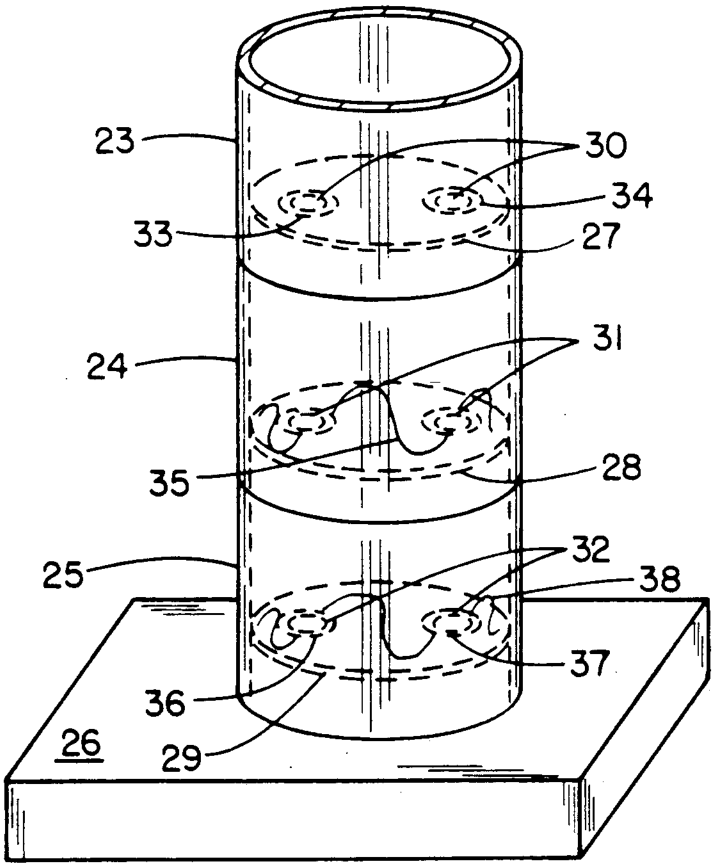
FIG. 5 is an isometric view of a multi-stage batch levitation separator.

A multistage batch separator is illustrated in FIG. 5, wherein a plurality of the separators illustrated in FIG. 4 are stacked one above the other to separate superconductive particles, superconductive particles which are partially susceptible, partially superconductive particles and non-superconductive particles from one another. As illustrated in FIG. 5, each of the separators 23, 24 and 25 are vertically arrayed over a mechanical vibrator 26. Each of the separators has an associated intermediate plate 27, 28 and 29 which have passageways, 30, 31 and 32 defined therein. Each of these passageways is associated with a means for supplying a magnetic field gradient to block the passage of superconductive particles therethrough, by application of the Meissner effect force. In the separator illustrated at 23, a pair of ring magnets 33 and 34 are illustrated while in the separator illustrated at 24, a single electromagnetic coil 35 is schematically illustrated. In separator 25, the intermediate support plate 29 is provided with both permanent magnets 36 and 37 and an electromagnetic coil 38.

In operation, a mixture of superconductive, and non-superconductive particles is fed to separator 23 at or below the temperature $T_c$ of the superconductive particles to be separated. The strongly superconductive particles will levitate above the ring magnets 33 and 34, while the superconductive particles having partial susceptibility, the partially superconductive particles and non-superconductive particles will pass through the passageways 30 by virtue of the mechanical vibrator action supplied by vibrator 26. The apparatus illustrated in FIG. 5 provides two additional stages of separation wherein each of the following intermediate separators applies a stronger magnetic field gradient to its passageways than did the previous separator. A portion of the superconductive particles having partial susceptibility and partially superconductive particles will be retained in the upper portion of separator 24, while the remainder of the partially superconductive and non-superconductive particles will pass through passageway 31 into separator 25 by virtue of vibrator 26. Separator 25 is equipped with both ring magnets 36 and 37, and an electromagnet 38 which provides the strongest magnetic field gradient of the three separators. In this stage, any partially superconductive particles or superconductive particles having a weak susceptibility will levitate above the intermediate support plate 29, while the non-superconductive particles will pass through the passageways 32 into the bottom stage of separator 25. After the batch has been separated, each of the respective containers 23 may be removed from its stacked position, with the separated particles now divided into four separate grades, which may be referred to as: strongly superconductive particles, partially susceptible superconductive particles, partially superconductive particles, and non-superconductive particles. Depending upon the degree of susceptibility, and the field strength of the gradient applied, some of the partially susceptible and partially superconductive particles will be intermixed. Separation between these two is best accomplished with a volume or mass vector as will be hereinafter described.

Again it is to be understood that the device illustrated in FIG. 5 is schematic in nature, and any number of passageways, or any configuration for the containers or their intermediate support plate could be adopted which would facilitate the passage of the non-superconductive particles through the various passageways into the lower most section. In addition, each of the containers 23–25 could be filled with liquid nitrogen for the separation of ceramic superconductors as previously discussed. In addition, the fields applied by the electromagnets in stages 24 and 25 may be varied to select the specific susceptibility to the Meissner effect desired.

Figure 6:
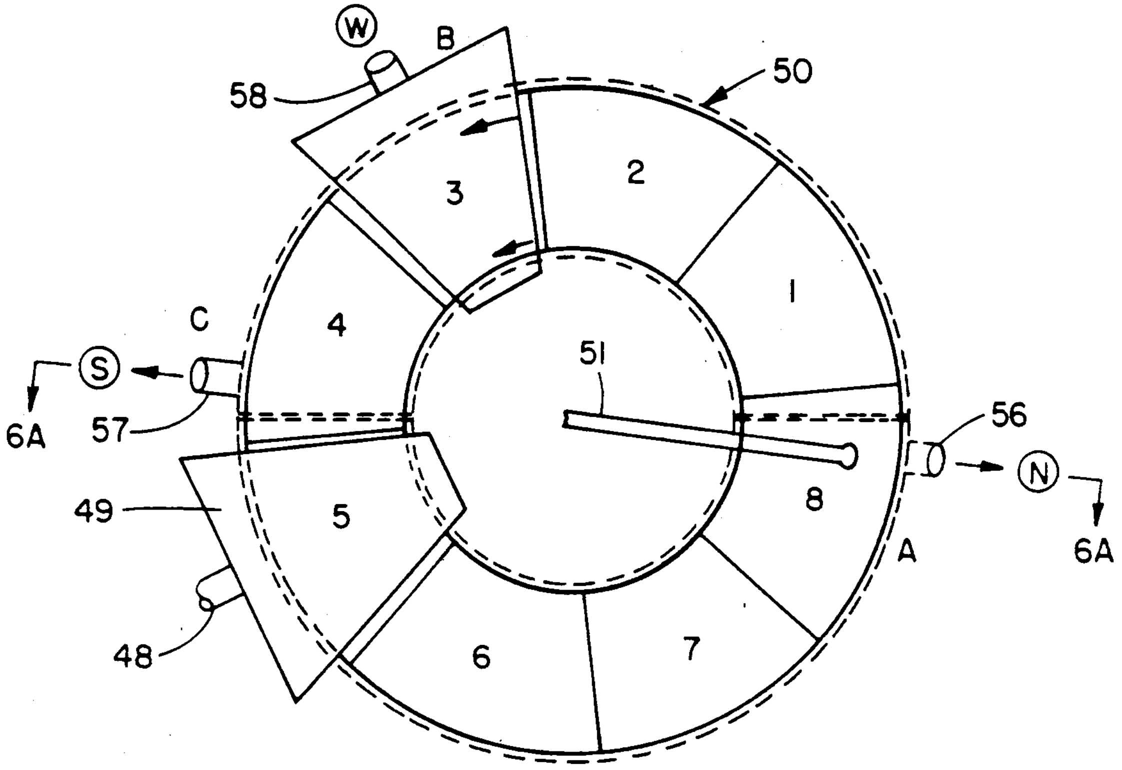
FIG. 6 is a plan view of a continuous levitation separator for separating superconductive particles from non-superconductive particles.
Figure 6A:
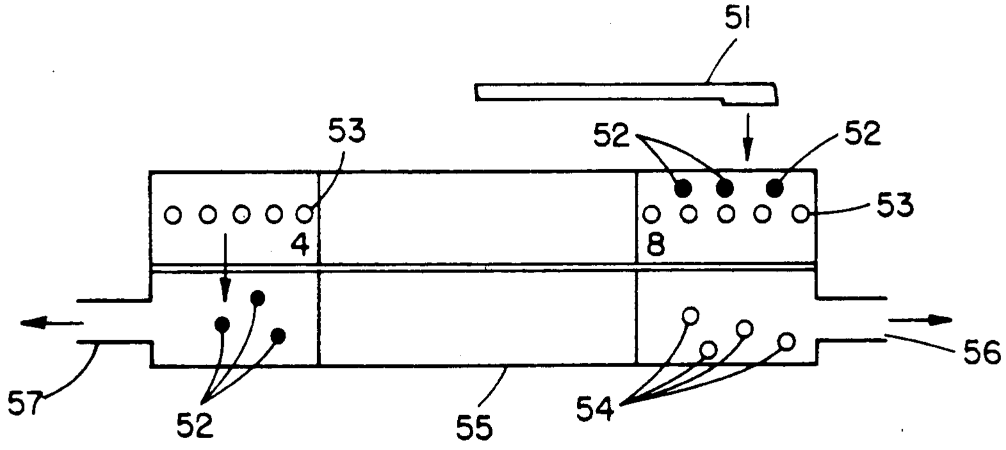
FIG. 6a is a cross-section of the apparatus demonstrated in FIG. 6.

FIG. 6 and 6*a* illustrate a continuous separator for separating superconductive particles from non-superconductive particles, although it is to be understood that the continuous separator illustrated in FIG. 6 could also be used to separate superconductive, partially susceptible superconductive particles, partially superconductive particles and non-superconductive particles. As illustrated in FIG. 6, a rotating annular compartmented container 50 is illustrated with compartments 1–8, two of which 4, 8, are illustrated in cross-section in FIG. 6*a*. A stationary overhead feeder 51 provides a continuous stream of superconductive and non-superconductive particles to the separation apparatus. As they are deposited in bin 8, as illustrated in FIG. 6*a*, the superconductive particles, schematically illustrated at 52 in FIG. 6*a*, interact with the magnetic field gradient generated by the electromagnetic coil means 53 disposed horizontally across container 8. The superconductive particles will be retained within bin 8, while the non-superconductive particles, schematically illustrated as 54 in FIG. 6*a*, fall into a lower stationary support 55 and are discharged through discharge port 56. The rotating annular compartment 51 rotates in a counterclockwise manner as illustrated in FIG. 6 until it arrives at position C, where upon the electromagnet is de-energized. Then, as illustrated in FIG. 6*a*, the superconductive particles 52 fall through the electromagnet and into the stationary container 55 to be discharged through port 57. Alternately, a third discharge point 58 can be provided at the position identified by the letter B in FIG. 6 wherein the electromagnetic field gradient generated by electromagnetic grid 53 is lowered, but not eliminated. At this position, the partially susceptible and the partially superconductive particles will fall through the electromagnetic grid 53 into the stationary collector 55, and be discharged through port 58, while the superconductive particles remain levitated above the electromagnetic grid 53.

Still another alternate embodiment is illustrated at station 5, where a heating means 49 is used to heat the superconductive particles above $T_c$, whereupon the particles fall through grid 53 and are discharged through outlet port 48. In this embodiment, permanent magnets with multiple passageways can be used in lieu of the electromagnetic grid 53.

As indicated previously with respect to FIGS. 4 and 5, the separator illustrated in FIGS. 6 and 6*a* operates with the superconductive particles supplied at a temperature below $T_c$ or with means for lowering the temperature of continuous operation below $T_c$.

Figure 7:
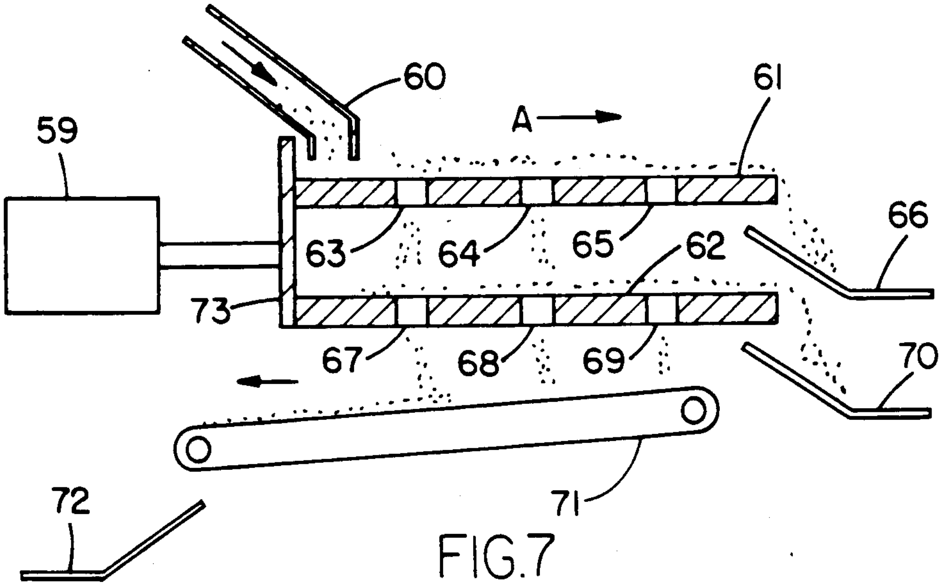
FIG. 7 is a partially cross-sectioned and diagrammatic view of a continuous multi-stage separator having two stages.
Figure 7A:
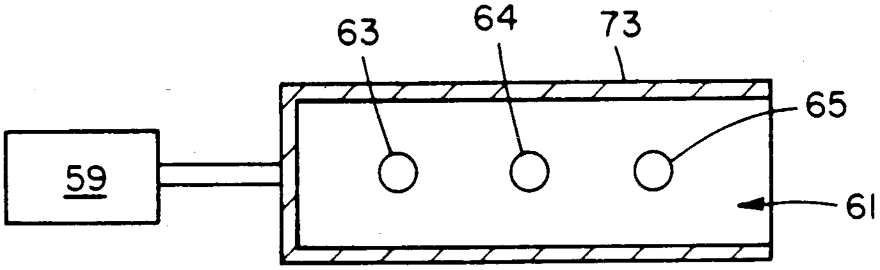
FIG. 7a is a top plan view of one embodiment of the apparatus illustrated in FIG. 7.
Figure 7B:
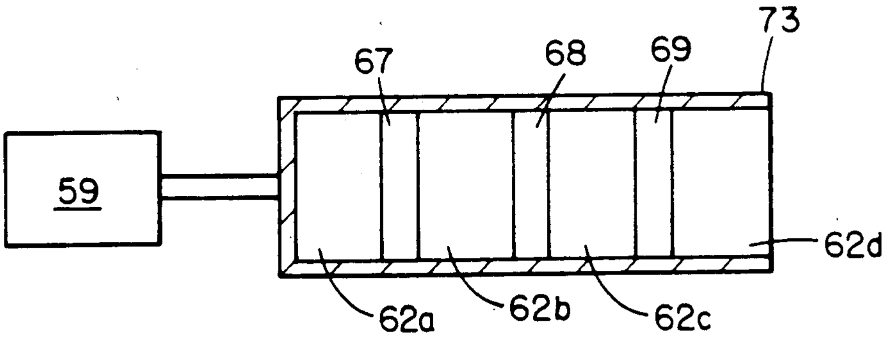
FIG. 7b is a top plan view of an alternate embodiment intended for use in the apparatus illustrated in FIG. 7.

Still another embodiment of a levitation separator is illustrated in FIGS. 7, 7*a* and 7*b* wherein a continuous stream of superconductive, partially susceptible, partially superconductive and non-superconductive particles is supplied through particle feeder 60 to a plurality of vibrating plates illustrated schematically by plates 61 and 62 in FIG. 7. Plates 61 and 62 are continuously vibrated by mechanical vibrator 59 and the plates 61 and 62 are tilted or angled with respect to the horizontal to create a gravitational flow of the material in the direction of arrow A as the plates are vibrated. Plate 61 is formed with a plurality of magnets having passageways 63–65 defined therein. The magnets apply a magnetic field gradient to each of the openings or passageways 63–65 and prevent the passage of superconductive particles therethrough by virtue of the Meissner effect force. The superconductive particles then pass in the direction of arrow A to the end of vibrating plate 61, and are collected by the superconductive particle receiver 66. The superconductive particles that are less susceptible to the Meissner force and the partially superconductive and non-superconductive particles pass through the passageways 63–65 to land on the second separator plate 62 which is also equipped with a plurality of passageways 67–69. Vibrating plate 62 is also formed of a plurality of magnets having a greater field strength than the magnets which formed plate 61. The field gradients formed by these magnets completely block the passageways 67, 68 and 69 to prevent the passage of the less susceptible and partially superconductive particles therethrough. These particles then move in the direction of arrow A by virtue of the tilt or slant of the plate, and the action of vibrator 59 to be collected by the partially superconductive particle receiver 70. The non-superconductive particles pass through the passageways 67–69 and are collected by conveyor 71 and passed to the non-superconductive particle receiver 72.

As illustrated in FIG. 7*a*, the plate 61 may be formed with a single bar magnet 61 having a plurality of openings 63–65 defined therein or it may be formed of a plurality of electromagnets 62*a*–62*d* which are transversely arrayed across the separator housing 73 with gaps or passageways 67–69 formed therebetween to provide for the passage of non-superconductive materials therethrough. The housing means 73 provides for lateral containment of the particles, to ensure the discharge of the particles to the appropriate particle receiver. The side walls of housing 73 have been omitted from FIG. 7 to more clearly illustrate the invention. It should also be noted that the permanent magnets illustrated in FIGS. 7*a* and 7*b* could be replaced with electromagnets as was previously discussed with respect to FIG. 6.

The embodiments illustrated in FIGS. 4–7 illustrate both continuous and batch mode separators using the levitation principle for separating superconductive particles. superconductive particles that are partially susceptible, partially superconductive and non-superconductive particles. These embodiments are most effective in the separation of large particles, ranging from 1 micron to 0.5 inch in size.

SEPARATION BY PREFERENTIAL SEDIMENTATION

Figure 8:
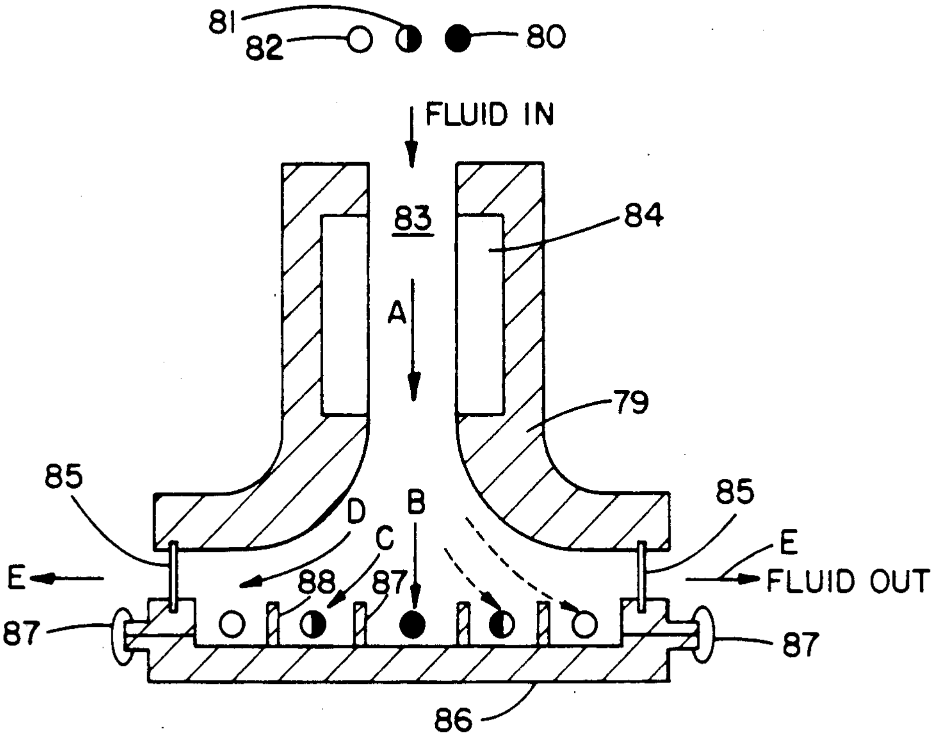
FIG. 8 is a cross-sectioned view of a batch sedimentation separator.
Figure 9:
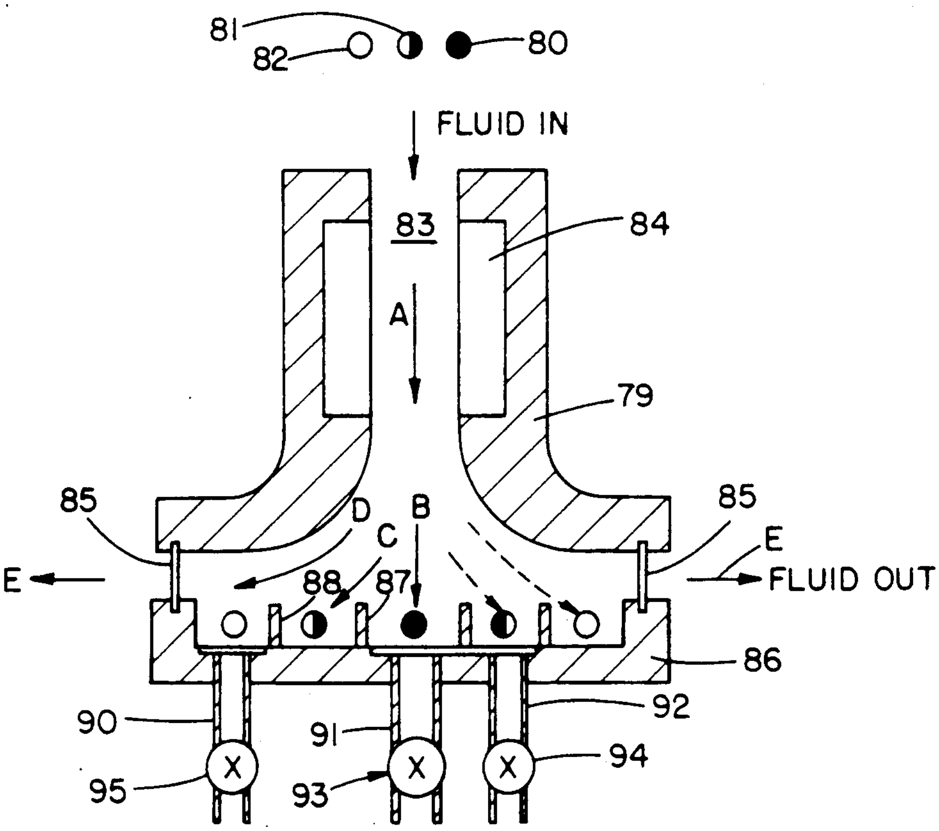
FIG. 9 is a partially cross-sectioned view of a continuous sedimentation separator and classifier.

The devices illustrated in FIG. 8 and FIG. 9 represent batch and continuous mode separators for separating superconductive particles by sedimentation. In these devices, the separation and/or classification of particles is achieved primarily by preferentially accelerating superconductive particles as they move against the magnetic gradient. The particle motion is therefore from a strong magnetic field to a weak magnetic field. These devices are the most effective for the separation and classification of medium size particles.

FIG. 8 illustrates a batch sedimentation separator for separating superconductive, partially susceptible partially superconductive and non-superconductive particles. As illustrated in FIG. 8, the device separates superconductive particles 80, partially susceptible superconductive particles 81 and non-superconductive particles 82 along a spatial gradient as will be hereinafter further explained. In operation, a feed of mixed particles are suspended in a fluid and passed downward through the inner space of a ring magnet 84, although many other magnetic arrangements are also possible. A sufficiently high fluid velocity is used to ensure that the superconductive particles will overcome the Meissner force barrier. Also, a sufficiently long magnet is used to ensure superconductive particles to have enough residence time to be re-accelerated to the velocity of non-superconductive particles. As the particles approach the bottom end of the magnet 84, the axial Meissner force now preferentially accelerates superconductive particles to higher downward velocities than non-superconductive particles. Furthermore, the radial Meissner effect force preferentially accelerates superconductive particles toward the center line, indicated in FIG. 8 as vector A (the effect of the radial Meissner effect force was demonstrated in Experiment 2). These Meissner effect forces (both axial and radial) help superconductive particles sediment just below the magnet while non-superconductive particles are carried away farther before they finally settle to the bottom. Partially susceptible superconductive particles settle between these extreme positions, thereby allowing separation and classification by the level of susceptibility to the Meissner effect force.

A radial means is then provided to divert the fluid flow into a second flow vector, which in the embodiment illustrated in FIG. 8 is a radially outward vector wherein the fluid flow is exhausted through a circumferential port 85 which extends radially around conduit 83. The movement of the particles (as heretofore previously described with respect to particle motion) is primarily from the fluid drag exerted by the diverted fluid along a second vector, which is illustrated by arrows E in FIG. 8. The superconductive particles however are primarily influenced by the accelerating forces of the magnetic field gradient emanating from magnet 84, and therefore are least affected by the added vector applied by fluid drag. These particles then tend to continue more or less along their first vector and are collected along the vector B as illustrated in FIG. 8. The partially susceptible superconductive particles are not as strongly affected by the Meissner effect magnet 84, and are therefore subject to both the radially outward vector E and the Meissner effect force vector to form a resultant vector C illustrated in FIG. 8. The non-superconductive particles, which are not affected by the Meissner effect force, are diverted by the fluid flow to form the resultant vector D illustrated in FIG. 8. The sedimentation pan 86 defines a series of classification bins or concentric rings, the first of which 87, defines a circular wall surrounding the area in which the superconductive particles are preferentially accumulated. A second collection wall 88, concentric with the first collection bin 87, provides a mid-point division for preferentially collecting the partially susceptible superconductive particles. A third sedimentation zone is provided between concentric wall 88, and the outer walls of the sedimentation pan 86 to collect the non-superconductive particles. The sedimentation pan is connected to the incoming conduit 79 by means of clips 87 so that the sedimentation pan can be removed after a batch of the particle mixture has been separated.

While a circular conduit and a radial spatial gradient have been illustrated with respect to FIG. 8, it should be understood that the device could function in a linear mode with the second fluid vector being imparted from a single direction. In this instance, the spatial gradient formed would be linear, rather than radial. In addition, the second fluid vector could be provided by means of fluid injection, or centrifugal force.

FIG. 9 illustrates a continuous sedimentation device in which the device illustrated in FIG. 8 is equipped with 3 output or discharge conduits 90, 91, and 92. When it is desired to remove the preferentially collected superconductive particles, valve 93 is opened and the collected particles are allowed to be flushed through conduit 91 by the incoming fluid through conduit 83. Likewise, when the partially superconductive particles are to be removed, valve means 94 is opened and the partially susceptible superconductive particles are withdrawn through conduit 92. The non-superconductive particles are removed through conduit 90 by means of valve 95.

SEPARATION BY CONCENTRATION

FIG. 10 illustrates a means for separating and classifying superconductive particles using a flow concentration device. These are devices in which the separation and classification of particles is achieved primarily by concentrating superconductive particles in a desired position in a flow path, where these particles can be collected. This device is particularly effective for the separation and classification of very fine particles 0.1 to 100 microns that are suspended in a fluid. FIG. 10 schematically illustrates a flow concentration device wherein a dilute particle suspension is fed continuously from the top of a non-magnetic tube 100. The feed flow rate is adjusted to insure laminar flow within the walls of the non-magnetic tube 100. As the particles approach the top of the magnet 101, the superconductive particles become subject to both vertical and radial Meissner forces. The vertical Meissner force, in this case, is relatively weak compared to the high drag force typical of very small particles in a laminar flow. Therefore, this repulsive force only slightly reduces the downward motion of the superconductive particles. In the meantime, the superconductive particles are rapidly accelerated towards the center line, along a second vector B with very little radial back mixing because of the laminar flow conditions. Further centering concentration occurs as the superconducting particles pass through the bottom of the magnet. The highly concentrated supercorducting particles in suspension at the center line are collected and withdrawn by means of a small thin tubing 103 as illustrated in FIG. 10. The remainder of the suspension, including the fluid and non-superconducting particles, exit through the bottom of the non-magnetic tube at 104. Magnet 101 may be replaced with an electric coil or solenoid to provide a variable field gradient for the device. When an adjustable solenoid coil is used in place of a ring magnet, the Meissner effect force can be varied by varying the solenoid coil current, and therefore the particle concentration at the center line can also be varied. These variations can be correlated to each other to determine certain properties of the superconductive particles. FIG. 11 illustrates one such example in which the magnetic susceptibility is correlated to the solenoid coil current for homogeneous superconductive particles. FIG. 11 illustrates the centering concentration (along axis X) versus solenoid coil current, (along axis Y) for different magnetic susceptibility values, wherein non-superconductive particles, with a susceptibility $\chi_P=0$ do not change their centering concentration as indicated by the flat curve 105. Strongly superconducting particles, having a maximum susceptibility of $\chi_P=-1$ are strongly moved toward the center line as indicated by curve 106. Partially susceptible superconductive particles $-1<\chi_P<0$ are illustrated along curve 107.

The device illustrated in FIG. 10 may also be used with turbulent flow conditions except that in this case, higher flow rates are used in order to handle higher particle concentrations.

FIGS. 2 and 3 illustrate two alternate means for handling superconductive particles which may be used in connection with any of the foregoing devices, or which may be used in the general processing in flow control of the superconducting particles. In the device illustrated in FIG. 2, a double wire solenoid is formed of windings 110 and 111 to enclose a three-dimensional space 112. Current is then passed through the double windings in opposite directions to create opposing lines of magnetic force. The superconductive particles to be stored are then dropped into the magnetic "container" and are levitated in by the applied gradients to a central location, equidistant along the magnetic field gradients, with some preferential shifting due to gravitational forces. The output of the magnetic container can be controlled by means of the magnetic flow controller as further illustrated in FIG. 3. In FIG. 3, a conduit 113 describes a first flow vector 114. A permanent magnet 115 and an electromagnet or solenoid coil 116 is provided for adding or regulating the magnetic field gradient of the permanent magnet 115. When the solenoid coil current is high, combined magnetic field gradient of the coil and the permanent magnet levitate the superconductive particles, as illustrated at 117, as a result of the Meissner effect forces. Alternately, the device illustrated in FIG. 3 can be used as a flow control device. When the particles are mixed with a fluid, the fluid drag force represented by the arrow A in FIG. 3 is counteracted by the Meissner effect force indicated by the arrow B. When the solenoid coil is de-energized, the particles will pass through the permanent magnet as indicated at 118 due to either gravitational force, or the fluid drag force exerted by the fluid flow 114.

CLASSIFICATION BY SIZE AND SUSCEPTIBILITY

As noted earlier, some superconductive particles in the sub-micron size are strongly superconductive, but only partially responsive or susceptible to the Meissner effect force. FIGS. 12–20 illustrate a series of devices and methods for sorting and classifying superconductive particles to a similar size and degree of magnetic susceptibility. It is believed that such classification will yield relatively homogenous particles. The combination of the Meissner effect force with a volume dependant force enables simultaneous classification by size and susceptibility.

Figure 12:
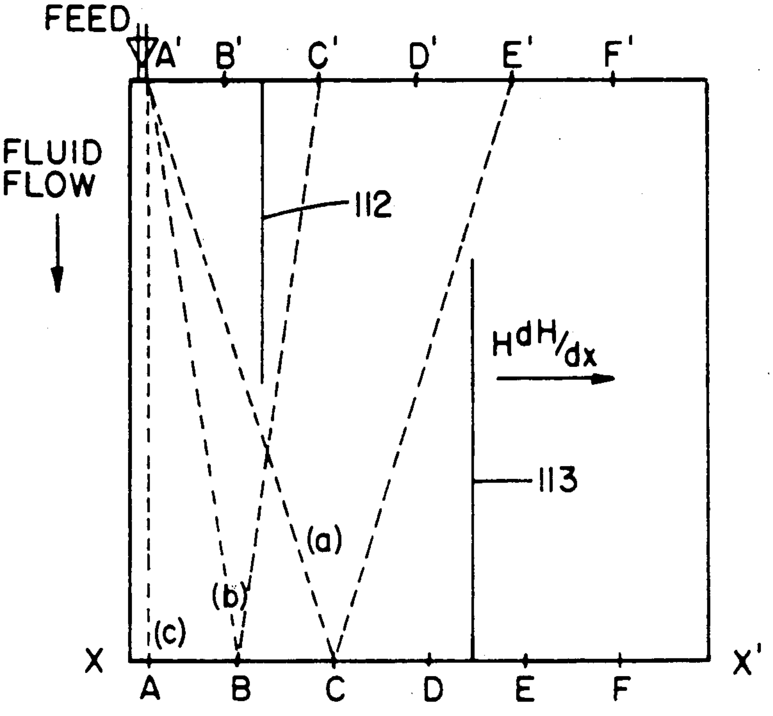
FIG. 12 is a diagrammatic view of a separator, and in which a constant magnetic field is applied across a flow of superconductive particles.

Consider a fluid at temperatures below $T_c$ in which a mixture of superconducting, partially susceptible superconducting, and non-superconducting particles are entrained. In addition, these particles may have a size distribution extending to the sub-micron region. In one process method, a constant value of H dH/dx is directed along the X axis, as shown in FIG. 12. H and dH/dx are the magnetic field and magnetic field gradient, respectively. Both H dH/dx and the fluid flow extend over the two-dimensional region shown and are constant in that region. The fluid may be liquid or gas; the only requirement is that it be at a temperature below $T_c$. Since the viscosity of gas is typically a few orders of magnitude smaller than that of liquids, the fluid drag against the particles can be minimized by using a gas fluid. Effects due to bubbles and turbulence caused by incoming radiation to the fluid can be minimized if the fluid is gas and particularly if the surrounding environment is kept at a lower temperature than the fluid.

The Meissner effect force of a superconducting particle of volume $V_p$ is described by the relation.

$$F_M = V_p \frac{\mu_o(\chi_p - \chi_f)}{1 + \frac{(\chi_p - \chi_f)}{3}} (H \cdot \nabla)H \qquad (11)$$

Here $\chi_f$ is the fluid volume susceptibility and $\chi_p$ is the particle volume susceptibility. From superconducting to non-superconducting particles $\chi_p$ varies from $-1$ to 0.

FIG. 12 shows the trajectories of (a) superconducting, (b) partially susceptible superconducting, and (c) non-superconducting particles of the same size. In this figure, the particle acceleration term is neglected.

Figure 13:
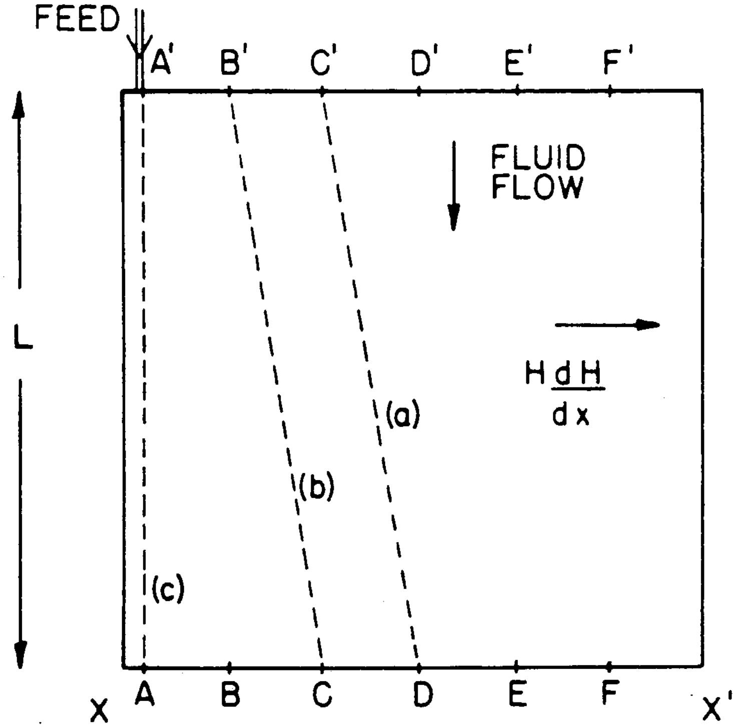
FIG. 13 is a diagrammatic view showing the flow paths of superconductive particles in a second pass through the separator of FIG. 12.

In order to facilitate and increase the separation along the X—X' line, the fluid flow region can be extended One way to accomplish this is to physically increase the length L. A second method is to reflect the particle path with appropriate devices so as to follow the paths BC' CE', etc. as shown in FIG. 12. This reflection may be accomplished by the insertion of suitable fluid baffles 112, 113 which will reflect the carrier fluid back across the magnetic field gradient Another method is to recycle the fluid (and entrained particles). In the recycle scheme, particles collected at point A are carried back to point A', particles collected at point B are carried back to point B', etc. in a continuous manner. The second pass through the system, as depicted in FIG. 13, further enhances the separation. Constant diameter particles can be separated according to their degree of susceptibility to the Meissner effect force ($\chi_p$ value). Alternatively, particles with constant $\chi_p$ can be separated according to their size. This method concentrates similar particles--that is, particles having both similar degree of susceptibility and similar size. It can be used in either a batch or continuous flow process.

Figure 14:
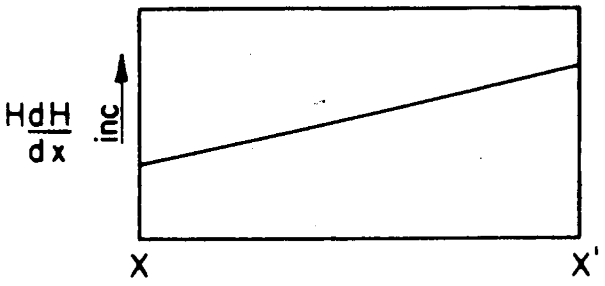
FIG. 14 is a graph illustrating how a magnetic field may increase in a direction.
Figure 15:
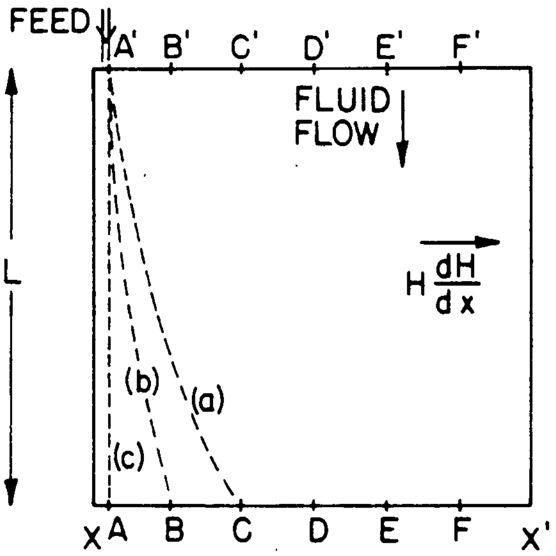
FIG. 15 is a diagrammatic view showing the flow paths of superconductive particles through the separator of FIG. 12, but when a magnetic field increasing as shown in FIG. 14 is applied to the particles.
Figure 16:
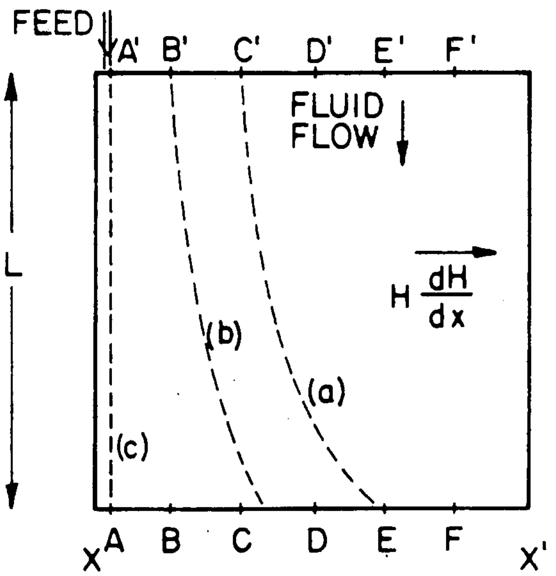
FIG. 16 is a diagrammatic view showing the flow paths of superconductive particles in a second pass through the separator of FIG. 15.

In another embodiment of this invention, consider H dH/dx to vary in the XX' direction as shown in FIG. 14. FIGS. 15 and 16 show trajectories of the particles after one and two passes, respectively Likewise if H dH/dx varies in XX' according to the curve of FIG. 17, the trajectories of the particles are shown in the FIGS. 18 and 19.

In all three cases, superconducting particles are separated and concentrated according to their degree of superconductivity and their size.

Figure 17:
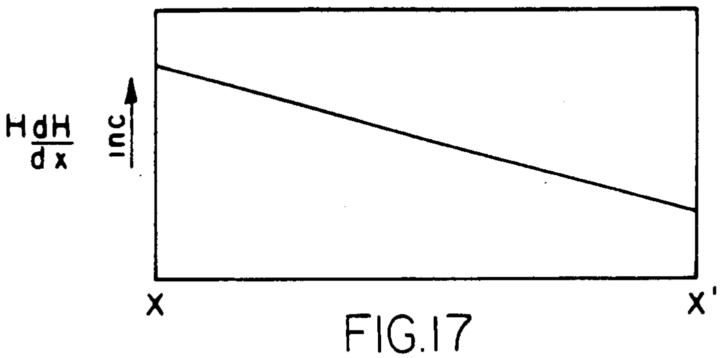
FIG. 17 is a graph illustrating how a magnetic field may decrease in a given direction.
Figure 18:
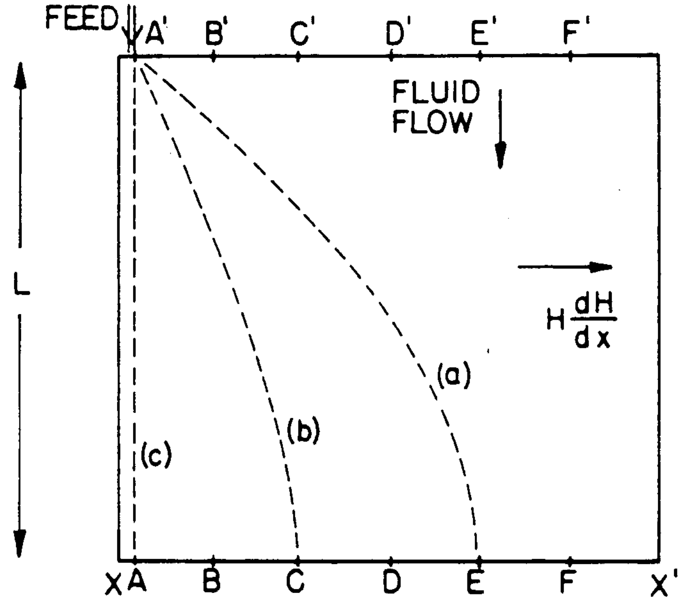
FIG. 18 is a diagrammatic view showing the flow paths of superconductive particles through the separator of FIG. 12, but with the magnetic field decreasing across the separator as shown in FIG. 17.
Figure 19:
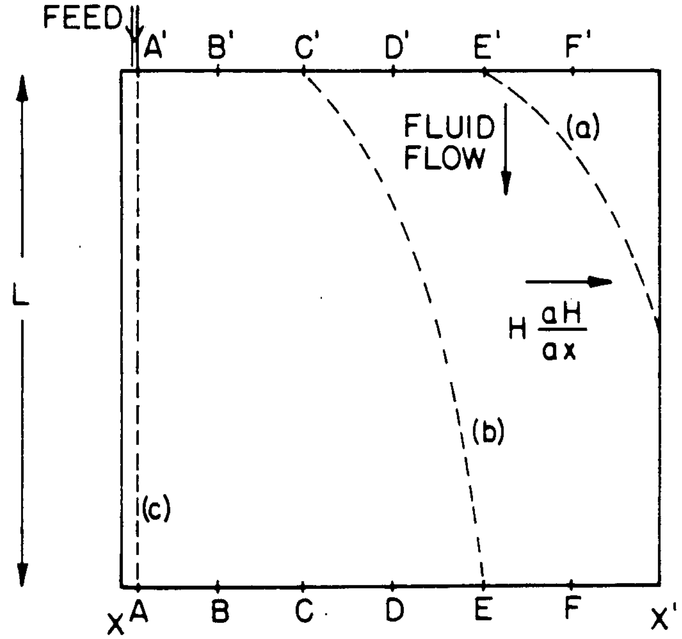
FIG. 19 is a diagrammatic view showing the flow paths of superconductive particles in a second pass through the separator of FIG. 18.
Figure 20A:
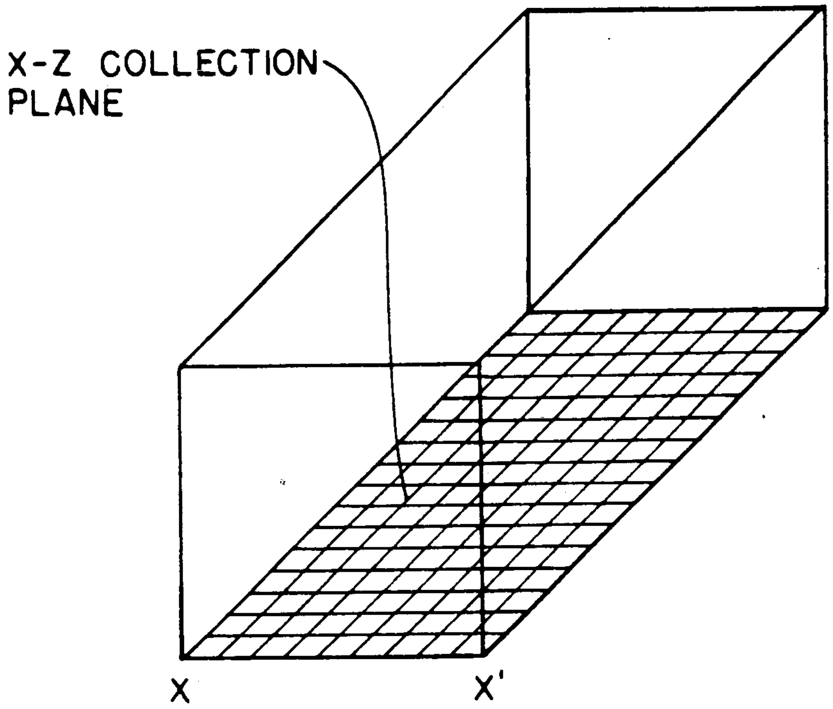
FIG. 20a diagrammatically illustrates a three-dimensional separator for separating superconductive particles according to volume and degree of susceptibility to the Meissner effect.
Figure 20B:
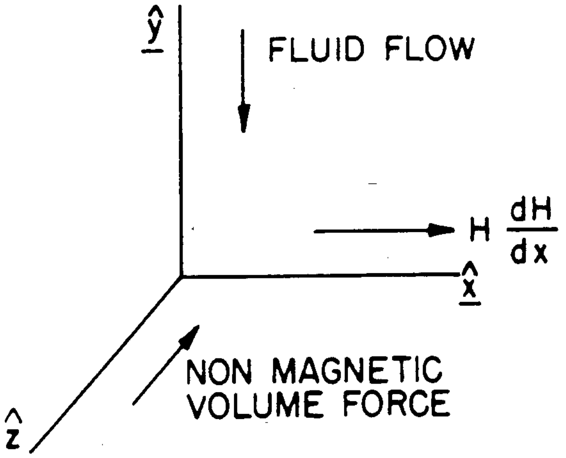
FIG. 20b diagrammatically illustrates the direction of fluid through the separator of FIG. 20a, and the directions of various forces applied to the fluid flow.

In yet another embodiment of this method, a nonmagnetic mass force such as gravity is also applied at predetermined angles with respect to the flow vector direction and the direction of H dH/dx. Especially when this force is directed along the Z axis (perpendicular to the plane of FIGS. 12, 13, 15, 16, 18 and 19), superconducting particles can be simultaneously separated according to their volume, mass and degree of susceptibility to the Meissner force in a two-dimensional X-Z plane. Here H dH/dx in the X direction is independent of Z and Y and is constant, or varies (in the direction) as shown in FIGS. 14 or 17, or can vary in some combination of these. FIG. 20 schematically shows a device for implementing this method. It is the three-dimensional variant of FIG. 12. Here particles are separated along the X-Z plane.

The required values of H dH/dx for the methods described above can be obtained either by active (requiring current) or passive (permanent magnets) geometries or by a combination of these geometries. For example, the Franz Magnet, which is used in the commercially available Franz Magnetic Barrier Laboratory Separator, can supply H dH/dx values shown in FIGS. 14 and 17 as well as constant H dH/dx values, or combinations of these values over an extended Y-Z range. The fluid with entrained particles can be passed through the systems described several times in succession or in continuous mode. A number of commercially available fluid pumps can be used for this purpose, and baffles and other geometric constraints can be employed at the input and output of the recycle stage so that the fluid flow closely approximates constant flow in the regions shown.

SEPARATION BY FIELD GRADIENT GEOMETRY AND MASS

The Meissner effect force $F_m$ of a spherical superconductive particle of volume $V_p$ and apparent susceptibility $\chi_p$ placed in a magnetic field of H is given by (when $\chi_f=0$).

$$F_m = \frac{\chi_p}{1 + \frac{\chi_p}{3}} \mu_o V_p \nabla H^2 \qquad (12)$$

Since $_p$ is negative for superconductive particles ($-1<\chi_p<0$), the Meissner effect force is exerted in the direction of decreasing $H^2$ in a magnetic field formed between two opposing poles of a very long magnet.

Therefore, when a superconductive particle is placed in the immediate vicinity of the pole face gap (such as the dotted rectangle in FIG. 21*a*), it will be subject to a force in the Y direction which tends to levitate the particle, as well as a force in the X direction which tends to accelerate the particle toward the centerline. The magnitude of the force in the X direction is shown in FIG. 21*b*, and the magnitude of the force in the Y direction is shown in FIG. 21*c*.

Figure 21A:
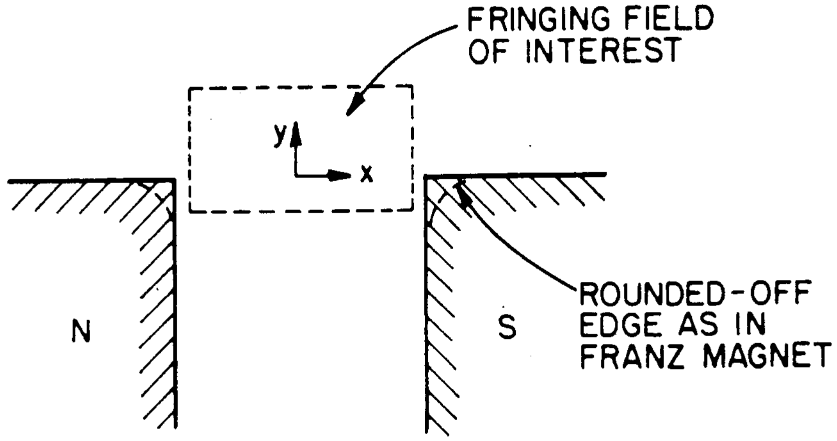
FIG. 21a diagrammatically illustrates an area of interest of a magnetic field that may be generated between poles of a magnet.
Figure 21B:
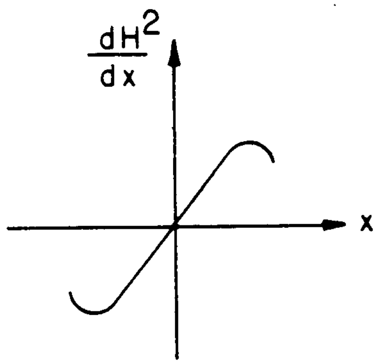
FIG. 21b is a graph showing how the strength of the magnetic field in the area outlined in FIG. 21a may vary in a first direction.
Figure 21C:
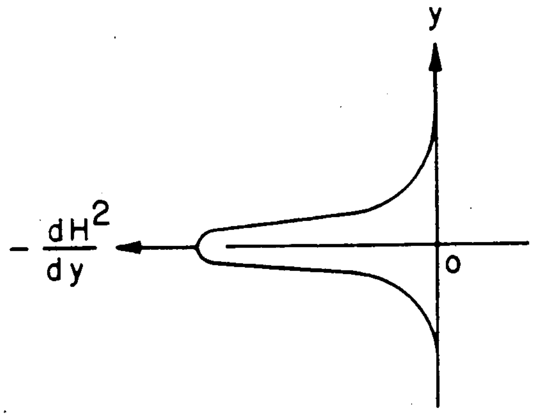
FIG. 21c is a graph showing how the strength of the magnetic field in the area outlined in FIG. 21a may vary in a second direction.

There-has been a great deal of design effort in the past to produce a broad, uniform gradient of $H^2$ in the field of FIG. 21*a*. For example, U.S. Pat. No. 4,235,710 describes one design method in which the edge of each magnet pole face is rounded off (as shown in broken lines in FIG. 21*a*) to substantially broaden the width of $dH^2/dx$.

Figure 22A:
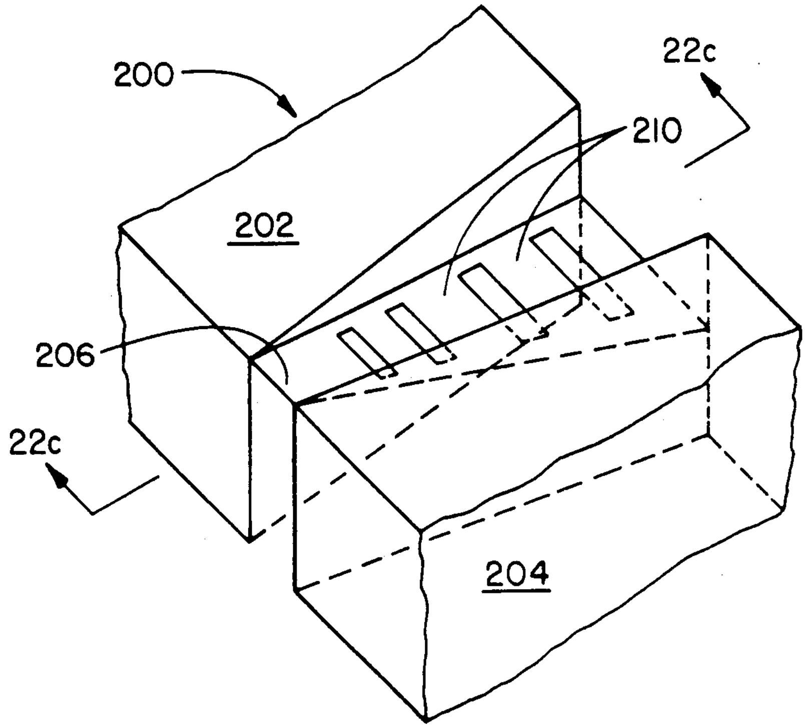
FIG. 22a is a simplified perspective view of a separator employing a variable magnetic pole face gap to separate superconductive particles according to degree of susceptibility to the Meissner effect.
Figure 22B:
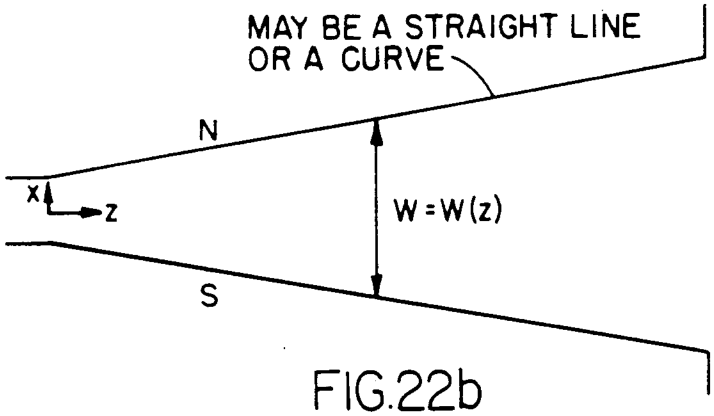
Figure 22C:
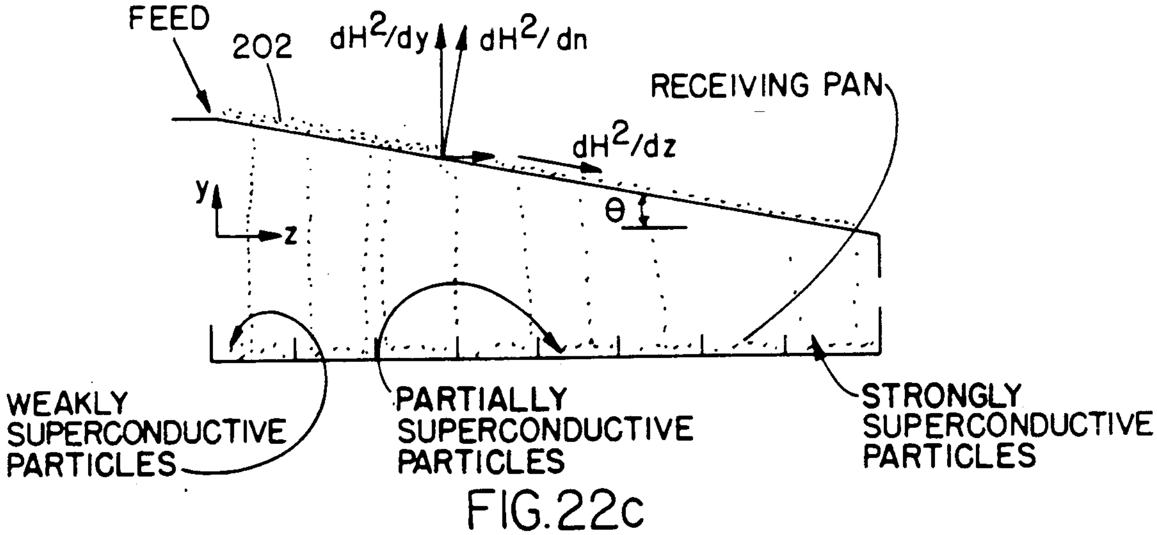
FIG. 22c is a simplified side view of the separator shown in FIG. 22a, taken along line 22c–22c

A particle separation device, illustrated in FIG. 22*a*, uses a unique magnet geometry to vary the field gradient. This device includes a pair of opposing magnetic poles 202 and 204, and a slanted plate 206 located between those poles. Plate 206 forms a multitude of transversely extending openings 210. A unique feature of this device is that the pole face gap width, w, is increased along the magnet length direction Z so that the $H^2$ value decreases along this direction. Therefore, the $dH^2/dy$ value is the highest at Z=0, and decreases continuously in the Z direction.

In this separation device, a mixture of particles 212 of different levels of superconductivity is introduced at Z=0. (Here, it should be emphasized that the term "superconductivity of a particle" is used synonymously with either the content of superconductive phase in the particle or the apparent magnetic susceptibility exhibited by a superconductive particle due to the alignment of the basal plane of the particle). In the entrance region where the $dH^2/dy$ value is the highest, only those particles that are completely non-superconductive or minimally superconductive ($\chi_p=0$) fall through, whereas superconductive particles move downstream while levitating. The downstream motion of the levitating superconductive particles is due to the Z-component of gravity and the Meissner effect force produced by the gradient of $H^2$ in this direction, or $dH^2/dz$ (in addition to $dH^2/dx$ and $dH^2/dy$ discussed previously). Further separation of the particles is then accomplished continuously in the Z direction as the $dH^2/dy$ value decreases continuously. Partially susceptible particles are separated and collected at 214–218, depending on their apparent susceptibility, while strongly superconductive particles are collected at 219.

A number of variations are possible in the design and operation of this separation device. Some of these possible variations are: a) the precise values of w(pole gap width) which may be a continuous or stepwise function of z, b) the orientation and placement of the separation device relative to gravity, c) the orientation and placement of the separation device relative to a fluid flow which may be used as a suspension means for the particles and/or as another source of nonmagnetic forces affecting the particle motion, and d) the method of producing the magnetic field (permanent magnet, electrical magnet, or combination of the two).

CONTINUOUS LEVITATION (MAGNETIC BARRIER) SEPARATION DEVICE WITH VARIABLE POLE FACE GEOMETRY

Figure 23A:
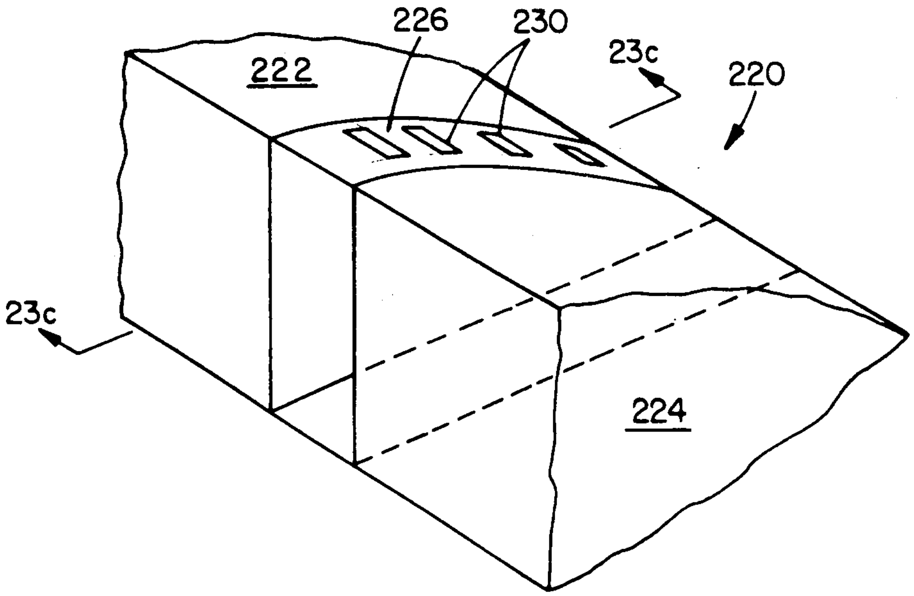
FIG. 23a is a simplified perspective view of a separator employing a variable magnetic pole face geometry to separate superconductive particles according to degree of superconductivity.
Figure 23B:
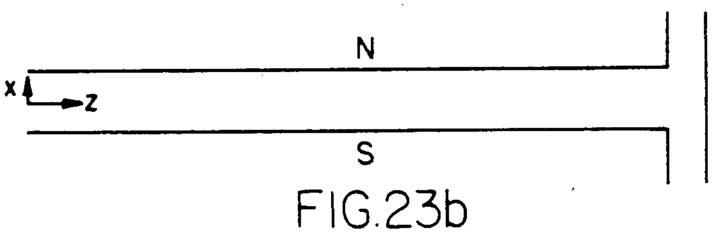

This device 220 is schematically illustrated in FIG. 23*a*. The device includes a pair of opposing magnetic poles 222 and 224, and a curved plate 226 located between those poles, and plate 226 forms a multitude of transversely extending openings 230. A unique feature of this device is that the pole face perimeter is curved. The slope of the curvature is the lowest at $Z=0$ where the particles are introduced, and gradually increases along the separation distance Z.

Figure 23C:
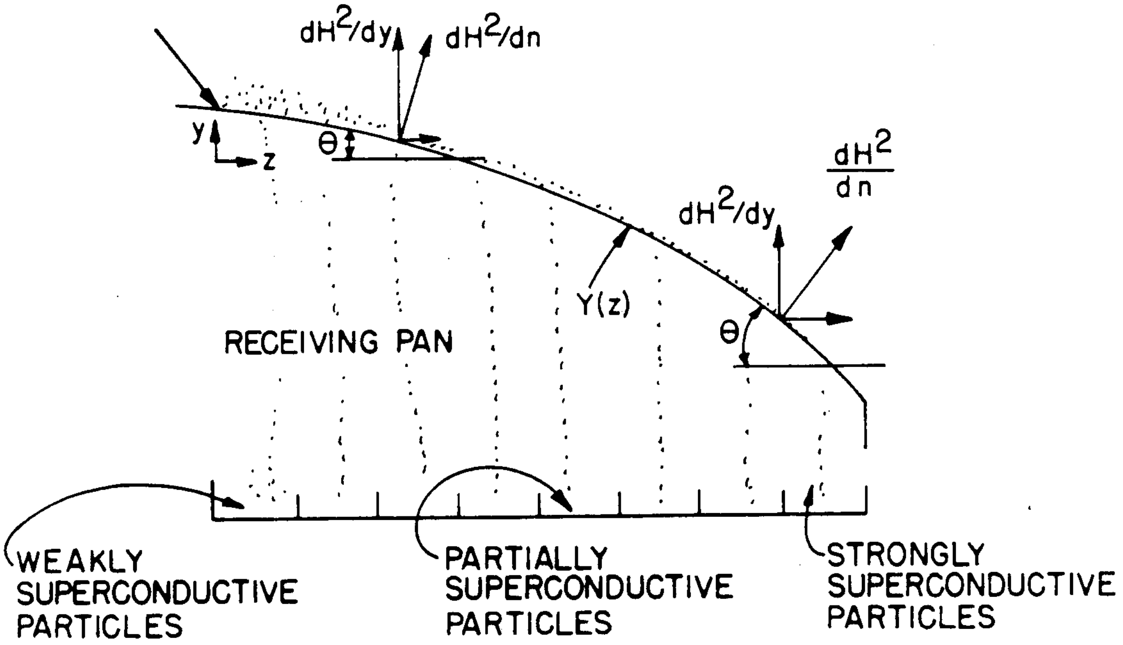
FIG. 23c is a simplified side view of the separator shown in FIG. 23a, taken along line 23c–23c

The $dH^2/dy$ value in this device is given by $$\frac{\partial H^2}{\partial y} = \frac{\partial H^2}{\partial n}\cdot\cos\theta \tag{13}$$

in which $\theta$ is the local slope of the pole face perimeter and $dH^2/dn$ is the derivative of $H^2$ normal to the perimeter, as shown in FIG. 23*c*. In a preferred embodiment, the $dH^2/dn$ value is made to be constant along the perimeter, thereby making $dH^2/dy$ primarily a function of $\theta$ which is in turn a function of Z. This variation of the $dH^2/dy$ value along the z-coordinate (and thus the variation of the vertical Meissner effect force) permits continuous separation of superconductive particles according to their susceptibility values. As illustrated in FIG. 23*c*, the non-superconductive particles are collected at 227, while partially susceptible particles are collected along a gradient from 228 to 233, depending on the particles apparent susceptibility. Strongly superconductive particles are collected at 234.

As in the previous device, a number of variations are possible in the design and operation of this separation device. Some of these possible variations are: a) the precise perimeter geometry Y(z) (illustrated in FIG. 23*c*) which may be a smooth curve or a succession of line segments, b) the orientation and placement of the separation device relative to gravity, c) the orientation and placement of the separation device relative to a fluid flow which may be used as a suspension means for the particles and/or as another source of nonmagnetic forces affecting the particle motion, and d) the method of producing the magnetic field (permanent magnet, electrical magnet, or combination of the two).

The examples below illustrate the calculation procedures for determining Y(z) for some cases of interest.

Example 1

Determine Y(z) when a mixture of superconducting particles of varying $\chi_p$ values is desired to be separated along the Z coordinate according to $z=Z(X_p)$. Consider gravity as the only nonmagnetic force involved in the separation.

At the position Z where the particle of apparent susceptibility $\chi_p$ falls through, $F_{my}+F_{gy}=0$. Therefore, $$\frac{\chi_p}{1+\frac{\chi_p}{3}}\,\mu_o V_p \frac{\partial H^2}{\partial n}\cos\theta = V_p P_p g \tag{14}$$

in which $$\cos\theta = \frac{1}{\left[1+\left(\frac{dY}{dZ}\right)^2\right]^{1/2}} \tag{15}$$

Substituting Equation (15) in (14) and solving for dY/dz gives $$\frac{dY}{dZ} = -\left[\frac{\chi_p}{1+\frac{\chi_p}{3}}\cdot\frac{\mu_o}{P_p g}\cdot\frac{\partial H^2}{\partial n} - 1\right]^{1/2} \tag{16}$$

Now if we let $\chi_p - Z^{-1}(z)$, the inverse function of the specified separation function $z=Z(\chi_p)$, Equation (16) further becomes $$\frac{dY}{dZ} = -\left[\frac{Z^{-1}(z)}{1+\frac{Z^{-1}(z)}{3}}\;\frac{\mu_o}{P_p g}\;\frac{\partial H^2}{\partial n} - 1\right]^{1/2} \tag{17}$$

Separating and integrating from $Y=Y_o$ at $z=0$ to any arbitrary position $$Y_o - Y = \int_0^z\left[\frac{Z^{-1}(u)}{1+\frac{Z^{-1}(u)}{3}}\;\frac{\mu_o}{P_p g}\;\frac{\partial H^2}{\partial n} - 1\right]^{1/2} du \tag{18}$$

This determines the perimeter geometry Y(z) as a function of z.

EXAMPLE 2

In the above example, determine $z=Z(\chi_p)$ when the mixture of particles having a $\chi_p$ distribution of $\Phi(\chi_p)$ is to be uniformly separated over a total distance of L.

In this particular case, whre the probability distribution function $\Phi(\chi_p)$ represents the cumulative fraction of particles having apparent susceptibility values between 0 and $\chi_p$, with $\Phi(0)=0$ and $\Phi(-1)=0$ $$z=Z(\chi_p)=L.\Phi(\chi_p)$$

EXAMPLE 3

In Example 1, determine $z=Z(\chi_p)$ when the mixture of particles having a 102 $_p$ distribution of $\Phi(\chi_p 0$ is to be preferentially separated over a total distance of L. providing greater (or smaller) separation distances for particles in selected $\chi_p$ ranges.

Here the separation distance must be preferentially weighted. Thus $$z = Z(\chi_p) = L \int_0^{\chi_p} \frac{d\Phi(u)}{du} q(u)du \quad (20)$$

in which $q(\chi_p)$ is the preselected weighting function. Note that this function has to be selected with caution so that the right hand side integral must be equal to unity when $\chi_p = -1$.

Levitation and Concentration Devices using Fluidized Particles and Reciprocating Magnetic Field Gradient Fluidization provides a practical means for enhancing the mobility of individual particles while maintaining a high particle concentration (number of particles per volume) close to that of the packed bed. The enhanced mobility begins at minimum fluidization where individual particles are released from the interlock with their neighboring particles and become substantially free to move in a fluid-like media. The minimum fluidization for given particles and fluid occurs at a certain fluid velocity which can be predicted with reasonable accuracy. The fluidization at this or somewhat higher fluid velocity is of primary interest to our separation processes. When the fluid velocity is much higher than the minimum fluidization velocity, the particles tend to mix completely. This defeats the purpose of particle separation.

While the physical dimensions of the magnetic field gradient $\nabla H^2$ is of importance to all of the aforesaid separation processes, these dimensions are often limited due to both technical and economical restrictions. The limitation could be very pronounced in the case of concentration devices, where the particles are generally desired to be separated over a substantial length. One method of circumventing this difficulty is to reciprocate a magnetic field gradient $\nabla H^2$ as a band in a preferred direction over the separation station (or equivalently, reciprocate the separating station over $\nabla H^2$). This effectively expands the $H^2$ gradient field dimensions. Also, the $\nabla H^2$ value can be varied along the reciprocating path.

Figure 24B:
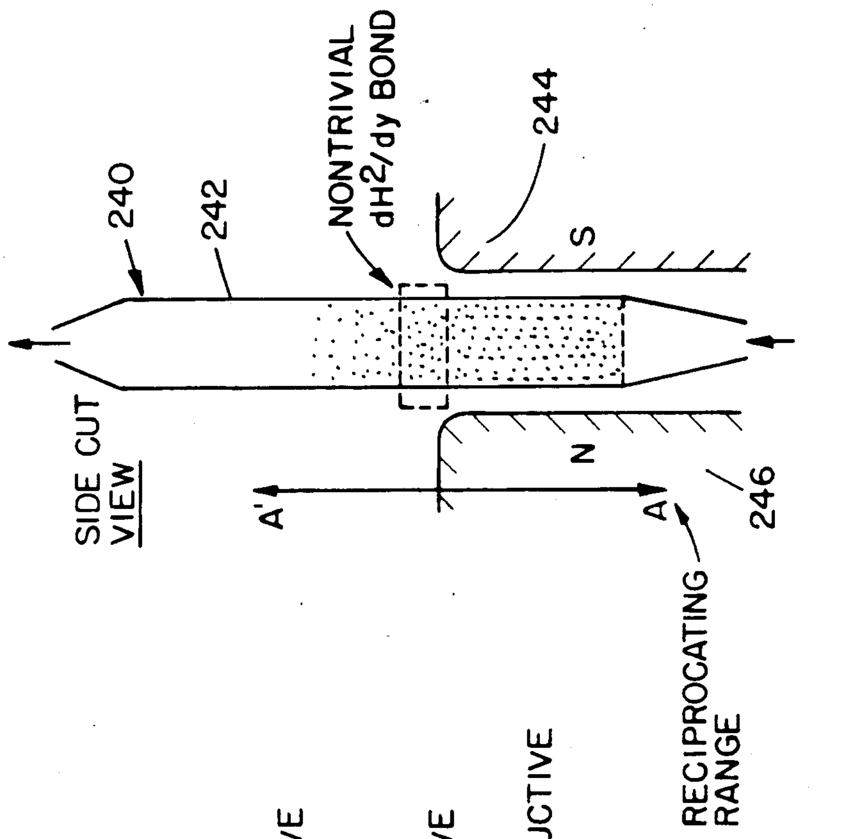
Figure 24A:
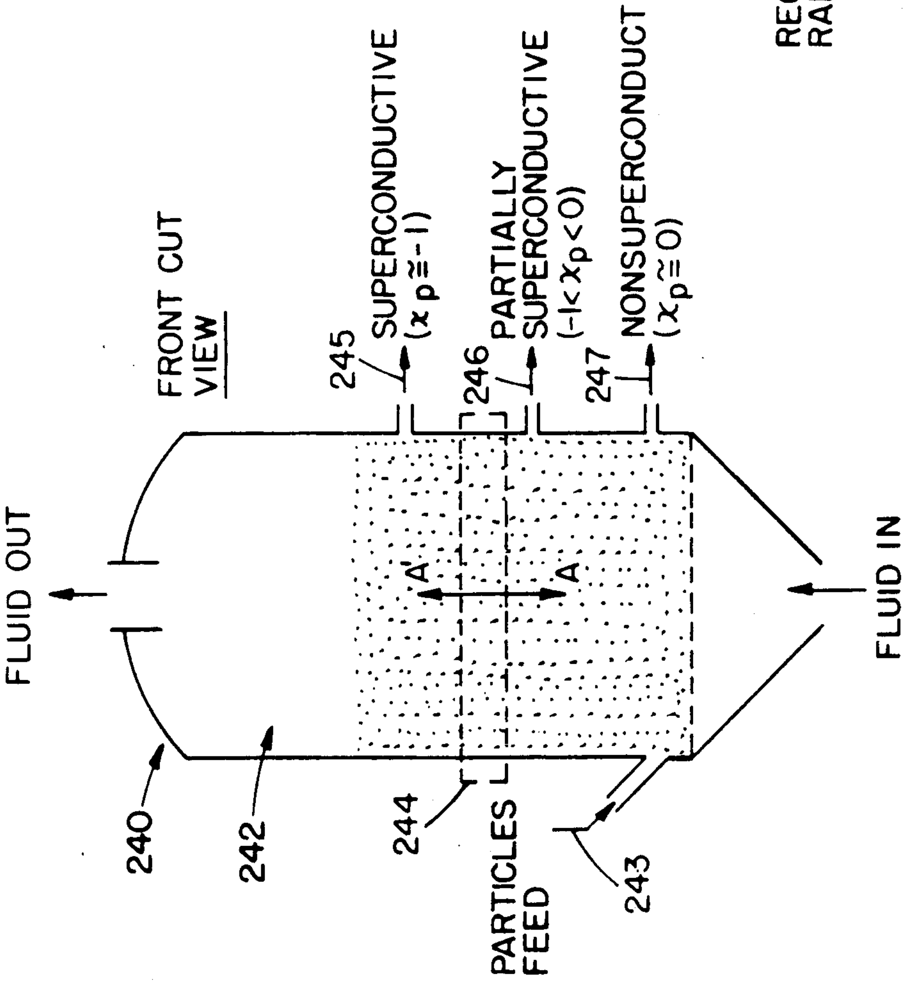
FIG. 24a is a front diagrammatic view of a fluidized bed container in which superconductive particles are separated according to degree of susceptibility to the Meissner effect.

As illustrated in FIG. 24*a* and 24*b*, the fluidized bed separation device 240 comprises a fluidized bed container 242 located between a pair of opposed magnetic pole faces 244 and 246. Here, a mixture of particles of varying apparent susceptibilities is introduced continuously at the bottom on the left hand side at 243 and the classified particles are continuously withdrawn at 245-247 on the right hand side. The strongly superconductive particles are withdrawn at 245, the partially susceptible superconductive particles are withdrawn at 241, and the non-superconductive particles are withdrawn at 247. Also, the fringing $\nabla H^2$ field band 244 is much narrower than the height of the bed over which the separation is desired. A vertical reciprocal motion of this field band, in combination with the particle motion imported by the fluidized bed, makes this separation process possible. This device can be used with a batch of particles as well as with a continuous feed of particles. As illustrated, the fringing field band or gradient is reciprocated from A to A' to traverse the entire depth of the fluidized bed. By varying the intensity of the bed, the rate of reciprocation, and the fluid velocity supplied to the bed, a particular value of susceptibility may be selectively withdrawn drom one or more intermediate locations, indicated as a single port 246 in FIG. 24*a*.

Figure 25B:
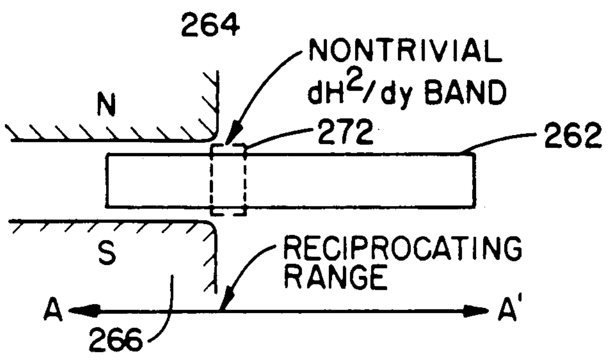
Figure 25A:
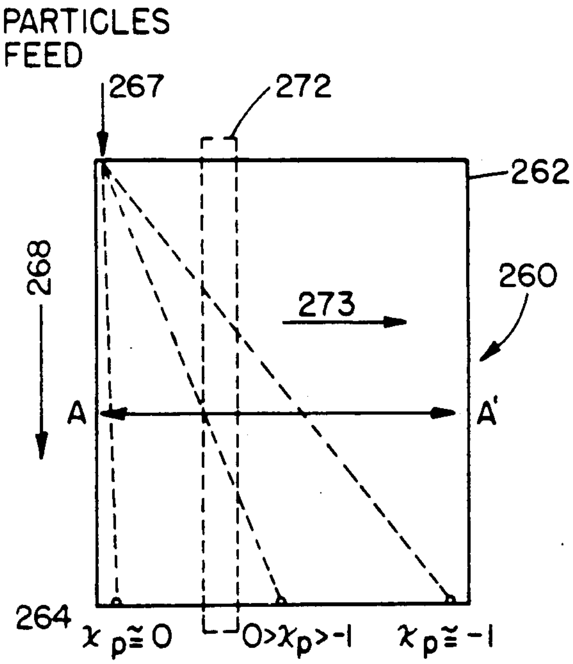
FIG. 25a is a front diagrammatic view of another embodiment similar to the embodiment illustrated in FIGS. 12–20 in which superconductive particles are separated according to degree of susceptibility to the Meissner effect by the imposition of a reciprocating magnetic field gradient.

FIGS. 25*a*-b and 26*a*-*b* disclose a concept of applying a reciprocating fringing $dH^2/dy$ to concentration devices earlier described. FIG. 25*a*-*b* being the application to the devices illustrated in FIGS. 12-19, while FIG. 26 applies this concept to the flow concentration device previously described with respect to FIG. 10.

As illustrated in FIG. 25*a*--*b*, a particle feed is introduced into separator pan 262 at 267. Particles are preferably entrained in a moving fluid which imparts motion along a first vector 268 which carries the fluid and the particle mixture to the opposite side of the classifying pan 262. A first field gradient is applied across the pan by permanent magnets 264, 266 which imparts a second vector to those particles that are susceptible to the Meissner effect force. The field gradient is applied in the direction of vector 273. The resultant vector of the particles distribute the particles across a gradient, which gradient is a reflection of the susceptibility values. Non-superconductive particles are collected and withdrawn as indicated at 269, partially susceptible superconductive particles are withdrawn as indicated diagramatically at 270 while strongly susceptible particles are withdrawn as indicated at 271. While a single port 270 has been illustrated, it should be noted that an actual practice, a variety of withdrawal locations or collection ports would be used to withdraw materials of varying susceptibility values. A fringing $dH^2/dy$ band 272 is reciprocated over the entire width of the collector pan from A to a' as illustrated in FIG. 25*a* and 25*b*. The fringing $dH^2dy$ band will vary the gradient applied by the fixed magnets 264, 266 and thereby alter the resultant vector of the particles collected at 270 and 271. By balancing the rate of fluid flow, the intensity of a fringing $dH^2/dy$ band, and the rate of reciprocation over the range A—A', a selected susceptibility value may be withdrawn at port 270. The direction of the reciprocating gradient may be parallel to the fixed gradient, angled with respect thereto, to transverse, if a three dimensional spread of particles is desired.

Figure 26B:
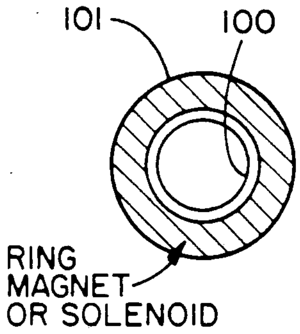
Figure 26A:
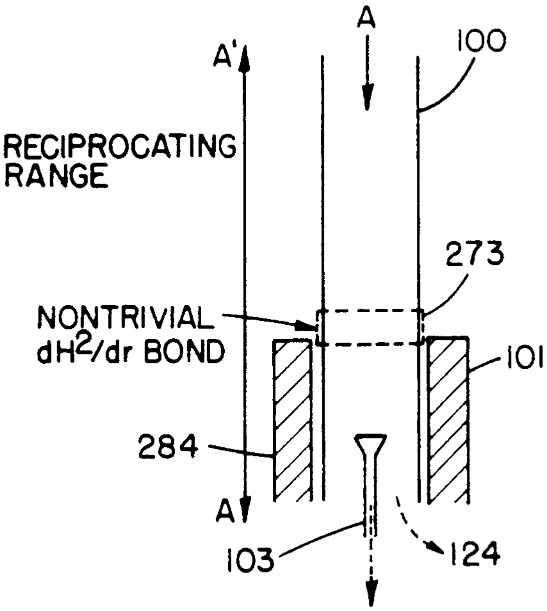
FIG. 26a is a side diagrammatic view of another embodiment similar to the embodiment illustrated in FIG. 10 in which superconductive particles are separated according to degree of susceptibility to the Meissner effect by the imposition of a reciprocating magnetic field gradient.

The fluid concentration device illustrated in FIGS. 26*a*, 26*b* is essentially the same as that previously described with respect to FIG. 10, wherein a mixed particle suspension is introduced at A and flows downwardly through to 100 to exit 104. If desired, the suspension exiting at 104 may be recycled for multiple passes through the separator to 100, as will be hereinafter described. A fringing $dH^2/dy$ band is applied as illustrated at 273 which reciprocates over the reciprocating range A—A'. This reciprocating nontrivial band alters the field gradients applied by permanent magnet 101, and thereby alters the resultant projectory of the superconductive particles entrained in the mixed suspension introduced at A. By varying the rate of fluid flow through to 100, the speed of reciprocation from A to A', and the strength of the fringing $dH^2/dy$ band, one may vary the susceptibility value of the superconductive particle collected by collector 103.

Figure 27:
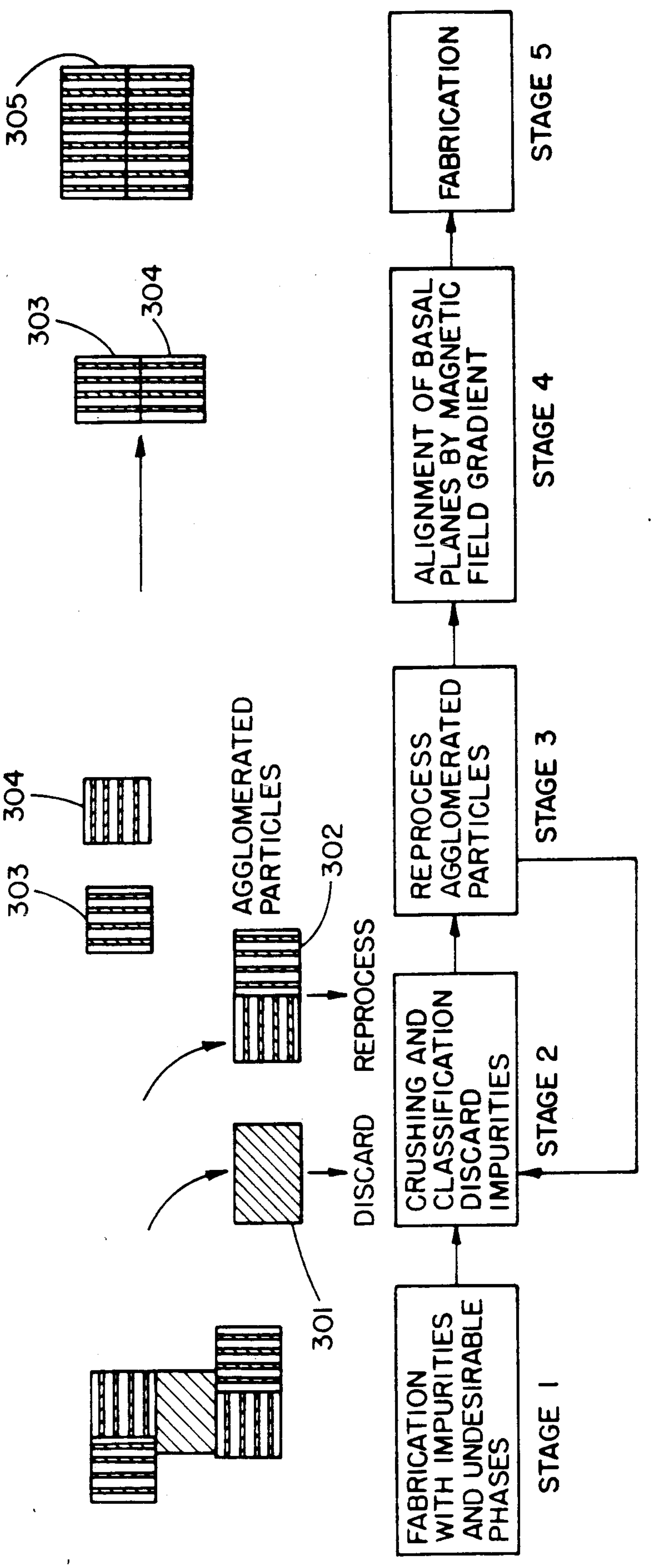
FIG. 27 is a flow chart of a process for the fabrication of superconductive devices from superconductive particles.

FIG. 27 is a diagramatic illustration of a flow chart of a method of fabricating superconductive materials from the newly discovered yttrium, bismuth and thallium materials, and their oxide based variations As illustrated in FIG. 27, stage 1 includes the fabrication of the bulk material in accordance with recipes reported in the literature. This superconductive material, including impurities and undesirable phases is then crushed as illustrated at stage 2 and classified in accordance with the devices hereinfore described with respect to FIGS. 5–26. The impurities, including non-superconductive phases of the ceramic materials are discarded as indicated at 301. The agglomerated particles, showing the strongest susceptibility to the Meissner effect force are recycled as indicated at stage 3 for further crushing and classification at stage 2. The reprocessing of the agglomerated particles shown at 302 is desired inasmuch as experiments indicate that the agglomerated particles showing highest susceptibility values, consist of particles having multiple superconductive basal planes, each of which is oriented in a different direction. This is illustrated figuratively at 302 in FIG. 27, and diagramatically at FIG. 27b wherein 3 individual grains are agglomerated into a single particle, each of the grains having a plurality of domain boundaries which define a basal plane. Since each of the particles is oriented in a different direction, the particle will exhibit a strong susceptibility to the Meissner effect force regardless of its physical orientation in space.

Figure 27A:
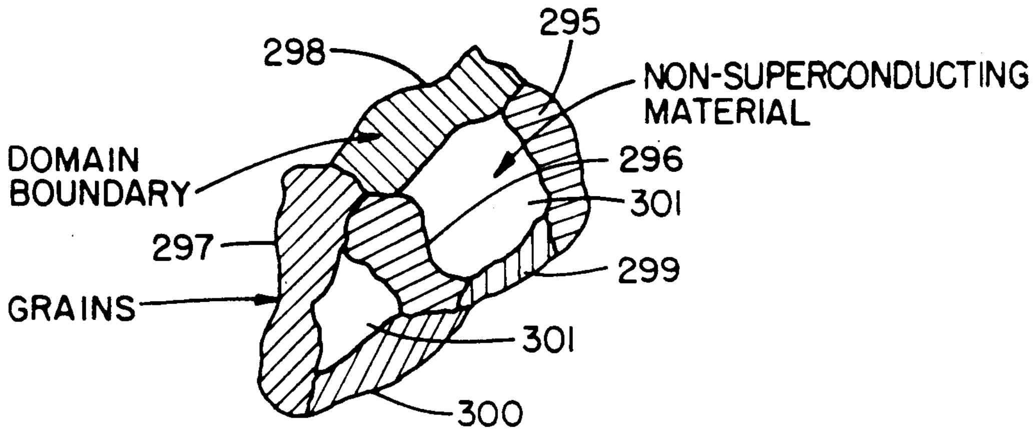
FIG. 27a is a diagramatic representation of an agglomerated particle having superconductive and non-superconductive materials therein.
Figure 27B:
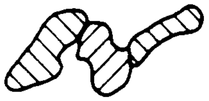
FIG. 27b is a diagramatic representation of an agglomerated particle of superconductive material.
Figure 27C:
FIG. 27c is a diagramatic representation of a single superconductive particle having a single basal plane of orientation.

The large particle illustrated at 27*a* includes substantial portions of non-superconducting material 301 and individual grains 295–300, all agglomerated into a single large particle. FIG. 27*a* is a figurative illustration of a Yttrium based superconductor, having a plurality of domains. It has been proposed that the superconductive phenomena occurs along or in connection with twinned domain boundaries in the Yttrium compound. The bismuth and thallium materials do not show comparable twinning, but it is believed that each exhibits a similar domain boundary oriented along a basal plane of the particle which contributes to and promotes the superconductive phenomena of the particle. When a single basal plane is present in a particle, as illustrated at FIG. 27*c*, and at 303, 304 in FIG. 27, the apparent susceptibility of the superconductive particle is significantly reduced. This drop in apparent susceptibility is due to the rotation of the free particle while entrained in the fluid, to a position wherein the basal plane is oriented parallel to and along the magnetic field of gradient. This reflects the highly anisotropic susceptibility of the superconducting particles on a small scale.

When the grains are agglomerated as illustrated in FIG. 27*c*, there is no preferential direction for alignment and the particle will be subject to much greater Meissner effect force. Single and agglomerated particles can be separated according to their susceptibility values as hereinbefore previously described. In the situation illustrated in FIG. 27*c*, the domain boundaries will align in the direction of the gradient, and the particle will experience a reduced volume susceptibility. In FIGS. 27*a* and 27*b*, however, the diamagnetism of the superconductive material will be substantially higher. The configuration illustrated in FIG. 27*b* will experience the largest Meissner force while the particle illustrated in FIG. 27*a* will experience an intermediate value since it contains a substantial amount of non-superconductive material. Since the apparent susceptibility of the particles illustrated in 27*a* and 27*b* are approximately the same, further separation of the particles by use of volume forces, such as fluid flow and or gravity will assist in classifying and selecting homogeneous types of particles for further processing.

Figure 27D:
FIG. 27d is a diagramatic representation of compacted superconductive particles after alignment of their basal planes.

Stage 4 of the process illustrated in FIG. 27 involves the alignment of the individual particles 303, 304 by a magnetic field gradient. It should be noted that particles 303, 304 are presently selected by a combination of size and susceptibility values to be relatively homogeneous group of particles. After classification, assembly, and orientation or alignment of the basal planes by magnetic field gradient, a superconductive device may be fabricated as noted at stage 5 of the application of isotatic pressing or other consolidation means. The fabrication of the superconductor device with congruently or parallel oriented basal planes illustrated at 305 and in FIG. 27*d* results in a device having a substantially higher critical current $J_c$.

While the foregoing description has provided a description of three different methods of separating and classifying superconductive particles, and a variety of devices for carrying out such separation, it should be understood that various modifications and alterations of the foregoing may be contemplated by those skilled in the art without departing from the scope of the invention, which is measured by the following claims.

What is claimed is:

1. A method of classifying superconductive particles by volume and by degree of susceptibility to the Meissner effect force, the method comprising:

feeding superconductive particles into a fluid, at a temperature below $T_c$, said particles having various degrees of susceptibility and various volumes;

directing the fluid in a first direction;

applying a first magnetic field gradient to the fluid in a second direction to accelerate the superconductive particles in said second direction, each of the superconductive particles being accelerated in the second direction, and to spatially dispense the superconductive particles along said second direction according to the degree of susceptibility of said particles;

a second magnetic field gradient reciprocating along an axis parallel to the second direction;

applying a force to each particle in a third direction proportional to the volume of the particle, wherein the superconductive particles become spatially dispensed along said third direction according to the volumes of the particles; and separating the superconductive particles into a plurality of groups according to the locations of the particles along said second and third directions.

2. A method according to claim 1, further including the step of collecting said groups of superconductive particles.

3. A method according to claim 1, wherein the first magnetic field gradient increases in the second direction.

4. A method according to claim 1, wherein the magnetic field gradient decreases in the second direction.

5. A method according to claim 1, wherein the first, second and third directions are mutually, orthogonal.

6. A method according to claim 1, wherein the step of applying a force to the particles in the third direction includes the steps of:

applying a constant force to the particles in the third direction to accelerate the particles in the third direction; and resisting the acceleration of each superconductive particle in said third direction with a force proportional to the volume of the particle.

7. A method according to claim 6, wherein said constant force is gravity.

8. A method according to claim 6, wherein the resisting step includes the step of moving the particles in the third direction relative to the fluid, wherein the fluid resists acceleration of the particles in the third direction.

9. A method of separating and classifying superconductive particles by levitation, comprising:

feeding a mixture of superconductive particles, partially susceptible superconductive particles and non-superconductive particles over a classifying plate at a temperature below $T_c$, said classifying plate extending in longitudinal and transverse directions and forming a multitude of transversely extending openings;

applying a magnetic field gradient to said mixture to apply a Meissner effect force to the particles, the strength of said magnetic field gradient varying in the longitudinal direction, wherein the magnitude of the Meissner effect force applied to the particles also varies in the longitudinal direction, and applying at least one force to the particles to urge the particles longitudinally over the classifying plate and through the openings in the classifying plate, to force each of a plurality of groups of the particles through a respective one of the transverse openings in the classifying plate according to the degree of susceptibility of the particles.

10. A method according to claim 9, further including the step of collecting said plurality of groups of the particles.

11. A method according to claim 10, wherein:

the classifying plate has front and back ends, and slants forwardly downward; and said at least one force is gravity.

12. A method of separating and classifying superconductive particles by levitation, comprising:

feeding a mixture of superconductive, partially superconductive and non-superconductive particles over a classifying plate at a temperature below $T_c$, the classifying plate extending in longitudinal and transverse directions, and forming a multitude of transversely extending openings;

applying a magnetic field gradient to the mixture to apply a Meissner effect force to the particles, the magnitude of the component of the magnetic field gradient varying along a third direction perpendicular to the longitudinal and transverse directions, wherein the magnitude of the Meissner effect force applied to the particles also varies along said third direction; and applying at least one force to the particles to urge the particles longitudinally over the classifying plate and through the openings therein, to force each of a plurality of groups of particles through a respective one of the transverse openings in the classifying plate according to the degree of susceptibility of the particles to the Meissner effect force.

13. A method according to claim 12, further including the step of collecting said plurality of groups of particles.

14. A method according to claim 12, wherein the classifying plate comprises a multitude of connected plate segments, each of the plate segments having a generally planar shape.

15. A method of classifying superconductive particles by degree of susceptibility to a Meissner effect force, the method comprising:

developing a fluidized bed of superconductive particles at a temperature below Tc, establishing a magnetic field gradient across the fluidized bed in a first direction to apply a Meissner effect force to the particles;

reciprocating a second magnetic field gradient relative to the fluidized bed in a second direction to spatially dispense the superconductive particles within the fluidized bed according to the degree of superconductivity of said particles; and withdrawing particles from a plurality of locations in the fluidized bed to withdraw a plurality of groups of superconductive particles, each of said groups having a respective degree of susceptibility to the Meissner effect force.

16. A method according to claim 13, wherein:

the developing step includes the step of continuously feeding superconductive particles into the fluidized bed; and the withdrawing step includes the step of continuously withdrawing particles from the fluidized bed.

17. A method according to claim 15 wherein the fluidized bed is held in an elongated, tubular container, and wherein the reciprocating step includes the steps of i) forcing particles having a high degree of susceptibility toward a radially inward portion of the fluidized bed, and ii) forcing particles having a low degree of susceptibility toward a radially outward portion of the fluidized bed; and the withdrawing step includes the steps of i) withdrawing particles having said high degree of susceptibility from the radially inward portion of the fluidized bed, and ii) withdrawing particles having said low degree of susceptibility from the radially outward portion of the fluidized bed.

18. A method as claimed in claim 17 wherein the reciprocating second magnetic field gradient is used to select particles having a predetermined degree of susceptibility.

19. A method of separating superconductive particles from non-.superconducting particles by levitation, said method comprising:

(a) feeding a mixture of superconductive, and non-superconductive particles to a first separator station at a temperature below $T_c$, said first separator station having at least one passageway defined therein for passing partially superconductive and non-superconductive particles therethrough, (b) vibrating said separator station to assist in the mechanical passage of said partially superconductive and non-superconductive particles, (c) applying a magnetic field gradient to each passageway defined by said separator station to block the movement of superconductive particles therethrough by the Meissner effect force, (d) removing the separated superconductive particles from said separation station, and (e) moving the separator station from a first location to a second location and then removing said magnetic field gradient whereby non-.superconductive particles pass through said passageway(s) at said first location, and superconductive particles pass through said passageway(s) at said second location.

20. A method of separating superconductive particles by levitation as claimed in claim 19 which further includes the step of moving a plurality of separator stations in a closed path, and removing the magnetic field gradient at the same location on the path to thereby continuously separate the superconductive particles from the incoming mixture.

21. A method of separating superconductive particles as claimed in claim 19 which further includes the step of moving the separator station from a first location to a second location and then raising the temperature of the particles above $T_c$, whereby non-superconductive particles pass through said passageway(s) at said first location, and superconductive particles pass through said passageway(s) at said second location.

22. A method of separating superconductive particles by levitation as claimed in claim 21 which further includes the step of moving a plurality of separator stations in a closed path, and raising the temperature of the particles above Tc at the same location on the path to thereby continuously separate the superconductive particles from the incoming mixture.

23. Means for separating superconductive particles by levitation, said means comprising:

(a) a first separator for receiving a mixture of superconductive, partially superconductive and non-superconductive particles, said first separator defining at least one passageway for passing partially superconductive and non-superconductive particles therethrough, (b) vibrating said first separator to assist in the mechanical passage of said partially superconductive and non-superconductive particles, (c) means for applying a magnetic field gradient to said at least one passageway to block movement of said superconductive particles therethrough by the Meissner effect force, (d) means for receiving the separated partially superconductive and non-superconductive materials after said superconductive particles have been separated, and (e) means for moving said separator from a first location to a second location, whereby said superconductive particles are removed at said second location.

24. Means for separating superconductive particles by levitation as claimed in claim 23 which further includes:

(a) a plurality of separators arranged for movement in a closed path from said first location to said second location, (b) means for de-energizing said magnetic field gradient when each of said separators has arrived at said second location, and (c) means for receiving said separated superconductive particles at said second location.

25. Means for separating superconductive particles by levitation as claimed in claim 23 which further includes:

(a) a plurality of separators arranged for movement in a closed path from said first location to said second location, (b) means for raising the temperature of the particles above $T_c$ when each of said separators has arrived at said second location, and (c) means for receiving said separated superconductive particles at said second location.

26. Means for separating superconductive particles by levitation as claimed in claim 24 or 25 wherein said plurality of separators are defined by a rotating annular compartmented container, with each of said compartments having at least one passageway and means for applying a magnetic field gradient to said at least one passageway, with said means for receiving said separated superconductive particles located at said second location below said rotating container.

27. A method of separating and classifying superconductive particles by sedimentation, said method comprising:

(a) feeding a mixture of superconductive, partially superconductive and non-superconductive particles into a moving fluid at a temperature below $T_c$, (b) directing the mixture and fluid along a flow path defining a first vector, (c) applying a magnetic field gradient to said flow path to accelerate the superconductive and partially superconductive particles preferentially along said first vector by the Meissner effect force, said magnetic field is at least 0.8 tesla, (d) altering the flow path of the fluid to add a second vector of movement to said particles by fluid drag, and (e) collecting the superconductive, partially superconductive and non-superconductive particles which are spatially dispensed along the direction of said second vector.

* * * * *

UNITED STATES PATENT AND TRADEMARK OFFICE
CERTIFICATE OF CORRECTION

PATENT NO. : 5,049,540

DATED : September 17, 1991

INVENTOR(S) : Jin Y. Park, et al.

It is certified that error appears in the above-identified patent and that said Letters Patent is hereby corrected as shown below:

Column 3, Line 39, after "or" insert --may not be suspended in a fluid. It is further an object of--.

Column 6, Line 11, after "22c-22c" insert --thereof.-- and "Fig. 23a..." should begin a new paragraph.

Column 6, Line 19, after "23c-23c" insert --thereof.-- and "Fig. 24a..." should begin a new paragraph.

Column 17, Line 35, "supercorducting" should read as --superconducting--.

Column 20, Line 24, "$_P$" should read as --$\chi_P$--.

Column 22, Line 33, "$\chi_P$-Z" should read as --$\chi_P$=Z--.

UNITED STATES PATENT AND TRADEMARK OFFICE

CERTIFICATE OF CORRECTION

PATENT NO. : 5,049,540

DATED : September 17, 1991

INVENTOR(S) : Jin Y. Park, et al.

It is certified that error appears in the above-identified patent and that said Letters Patent is hereby corrected as shown below:

Column 22, Line 57, "whre" should read as --where--.

Column 22, Line 60, "(-1)=0" should read as --(-1)=1--.

Column 22, Line 67, "$102_p$" should read as --$\chi_p$-- and "($\chi_p$0" should read as --($\chi_p$)--.

Column 23, Lines 33, 40, 42, 44 and 57, "$\nabla H^2$" should read as --$\vec{\nabla} H^2$--.

Column 24, Line 1, "drom" should read as --from--.

Column 24, Line 33, "a'" should read as --A'--.

Column 24, Line 34, "$dH^2dy$" should read as --$dH^2/dy$--.

UNITED STATES PATENT AND TRADEMARK OFFICE

CERTIFICATE OF CORRECTION

PATENT NO. : 5,049,540
DATED : September 17, 1991
INVENTOR(S) : Jin Y. Park, et al.

It is certified that error appears in the above-identified patent and that said Letters Patent is hereby corrected as shown below:

Column 24, Line 42, "to transverse" should read as --or transverse--.

Column 24, Line 65, after "variations" insert --.--.

Column 25, Line 46, "Fig. 27c" should read as --Fig. 27a--.

Column 26, Line 52, Claim 4, before "magnetic" insert --first--.

Column 28, Line 57, Claim 19, "separation" should read as --separator--.

UNITED STATES PATENT AND TRADEMARK OFFICE

CERTIFICATE OF CORRECTION

PATENT NO. : 5,049,540

DATED : September 17, 1991

INVENTOR(S) : Jin Y. Park, et. al.

It is certified that error appears in the above-indentified patent and that said Letters Patent is hereby corrected as shown below:

Column 29, Line 15, Claim 22, "Tc" should read as --$T_c$--.

Signed and Sealed this

Seventeenth Day of August, 1993

Attest:

BRUCE LEHMAN

*Attesting Officer*

*Commissioner of Patents and Trademarks*